(12) United States Patent
Lin et al.

(10) Patent No.: US 9,577,049 B1
(45) Date of Patent: Feb. 21, 2017

(54) SEMICONDUCTOR DEVICE STRUCTURE AND METHOD FOR FORMING THE SAME

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Shih-Yen Lin, Hsinchu (TW); Chong-Rong Wu, New Taipei (TW); Chi-Wen Liu, Hsinchu (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 14/989,259

(22) Filed: Jan. 6, 2016

(51) Int. Cl.
```
H01L 29/24      (2006.01)
H01L 29/45      (2006.01)
H01L 29/417     (2006.01)
H01L 29/78      (2006.01)
H01L 29/66      (2006.01)
H01L 21/443     (2006.01)
```
(52) U.S. Cl.
CPC ............ *H01L 29/24* (2013.01); *H01L 21/443* (2013.01); *H01L 29/41733* (2013.01); *H01L 29/45* (2013.01); *H01L 29/66969* (2013.01); *H01L 29/78* (2013.01)

(58) Field of Classification Search
CPC .......... H01L 29/24; H01L 29/45; H01L 29/78; H01L 29/41733; H01L 29/66969
See application file for complete search history.

(56) References Cited

U.S. PATENT DOCUMENTS

| 7,666,789 B2 * | 2/2010 | Choi ................... H01L 27/2436 257/E21.305 |
| 2015/0137075 A1 * | 5/2015 | Heo ..................... H01L 27/0922 257/29 |
| 2015/0372159 A1 * | 12/2015 | Englund ................. H01L 31/09 356/328 |

* cited by examiner

*Primary Examiner* — Jose R Diaz
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a semiconductor layer over the substrate. The semiconductor layer includes a transition metal chalcogenide. The semiconductor device structure includes a source electrode and a drain electrode over and connected to the semiconductor layer and spaced apart from each other by a gap. The source electrode and the drain electrode are made of graphene.

20 Claims, 25 Drawing Sheets

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-2 to 1H-2 are cross-sectional views illustrating a semiconductor device structure along a sectional line I-I' in FIGS. 1A-1 to 1H-1 respectively, in accordance with some embodiments.

FIGS. 2A-1 to 2B-1 are top views of various stages of a process for forming a semiconductor device structure, in accordance with some embodiments.

FIGS. 2A-2 to 2B-2 are cross-sectional views illustrating a semiconductor device structure along a sectional line I-I' in FIGS. 2A-1 to 2B-1 respectively, in accordance with some embodiments.

FIGS. 3A-1 to 3L-1 are top views of various stages of a process for forming a semiconductor device structure, in accordance with some embodiments.

FIGS. 3A-2 to 3L-2 are cross-sectional views illustrating a semiconductor device structure along a sectional line I-I' in FIGS. 3A-1 to 3L-1 respectively, in accordance with some embodiments.

FIG. 4-1 is a top view of a stage of a process for forming a semiconductor device structure, in accordance with some embodiments.

FIG. 4-2 is a cross-sectional view illustrating a semiconductor device structure along a sectional line I-I' in FIG. 4-1, in accordance with some embodiments.

FIGS. 5A-1 to 5B-1 are top views of various stages of a process for forming a semiconductor device structure, in accordance with some embodiments.

FIGS. 5A-2 to 5B-2 are cross-sectional views illustrating a semiconductor device structure along a sectional line I-I' in FIGS. 5A-1 to 5B-1 respectively, in accordance with some embodiments.

DETAILED DESCRIPTION

Figures 1, 1A:
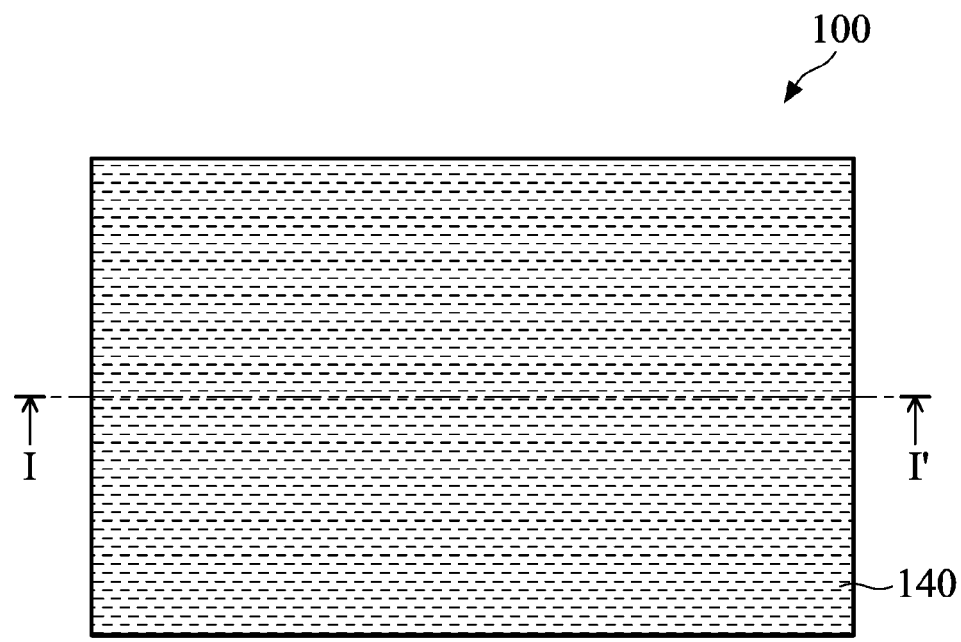
FIGS. 1A-1 to 1H-1 are top views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A, 2:
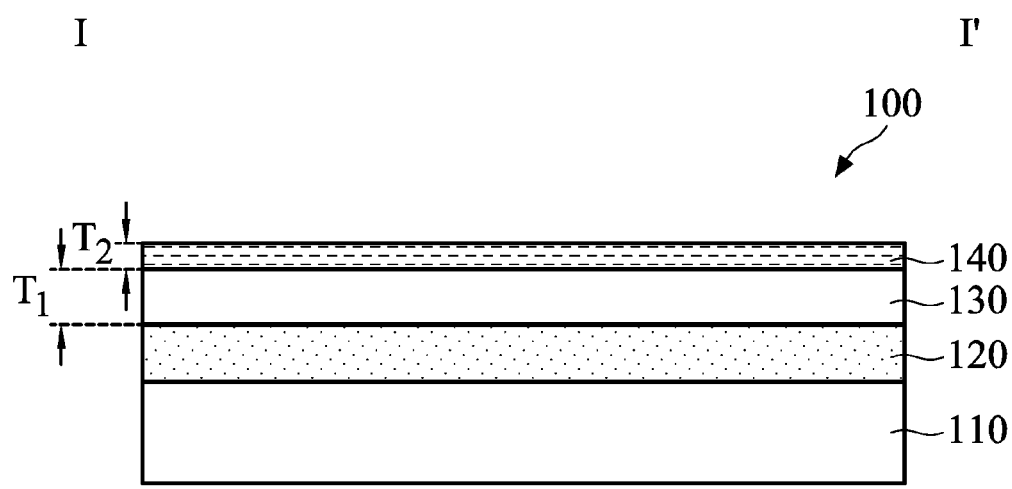
Figures 1, 1B:
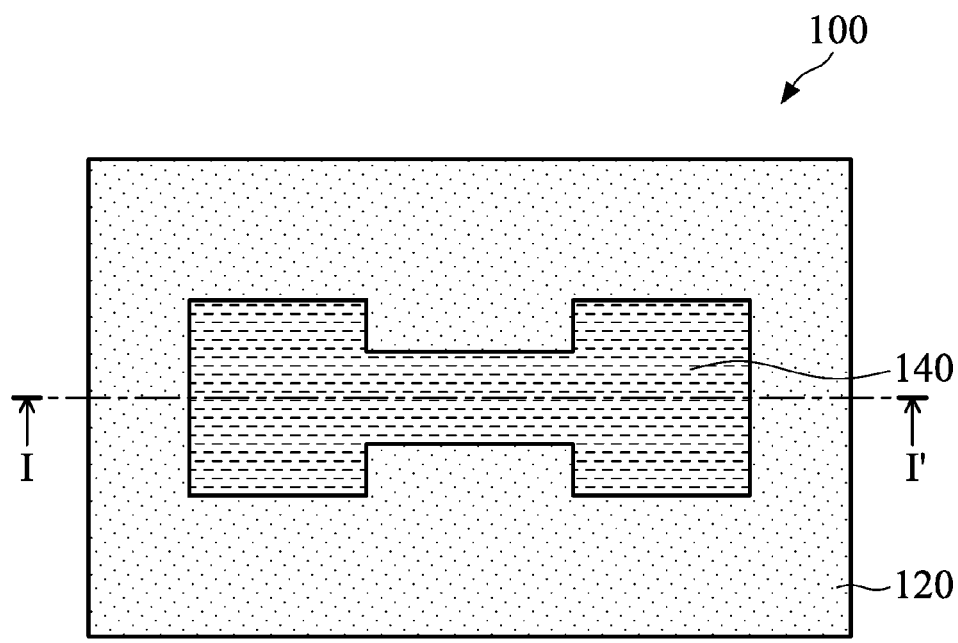
Figures 1, 1B, 2:
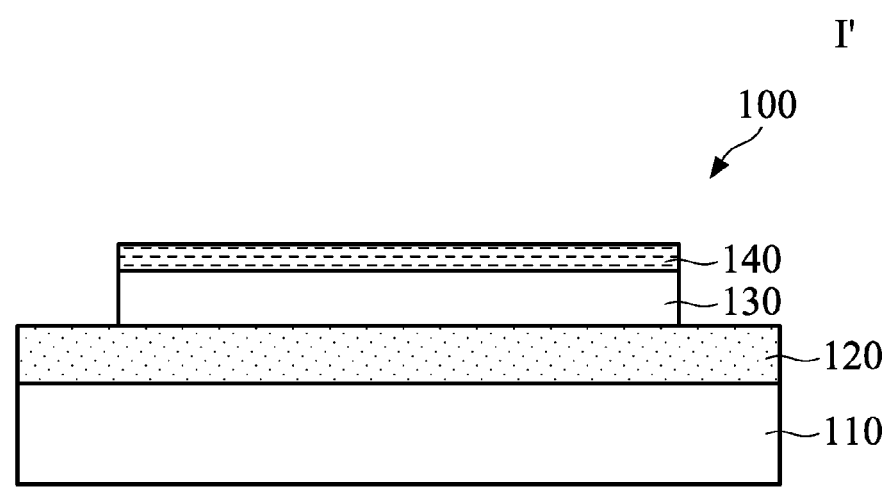
Figures 1, 1C:
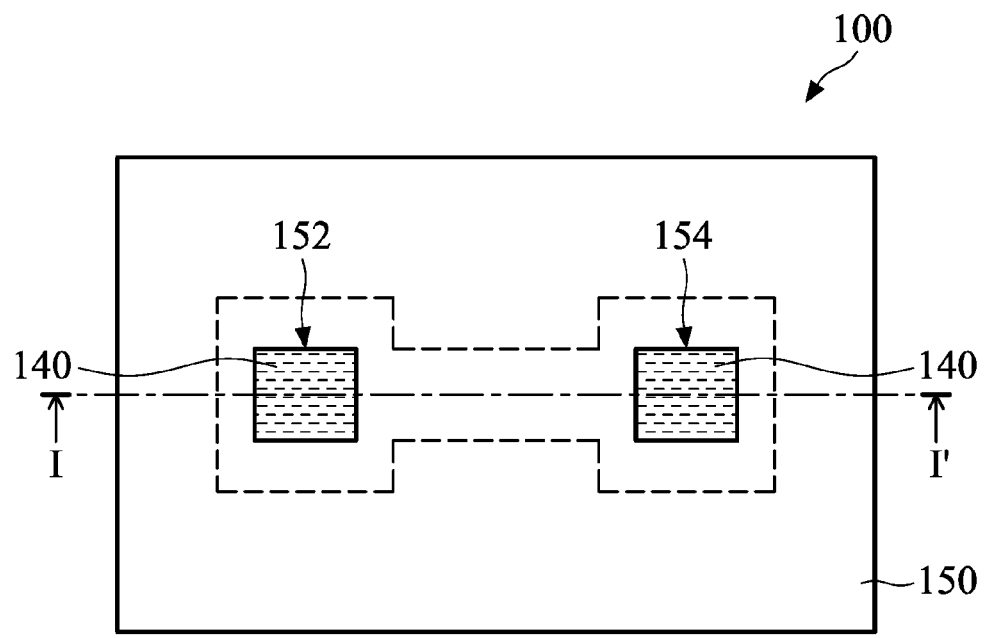
Figures 1, 1C, 2:
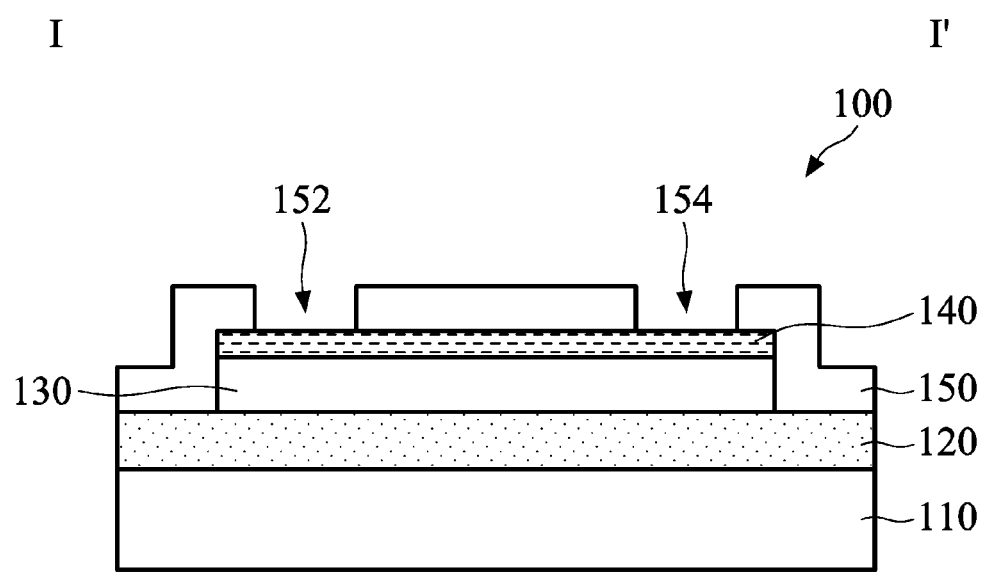
Figures 1, 1D:
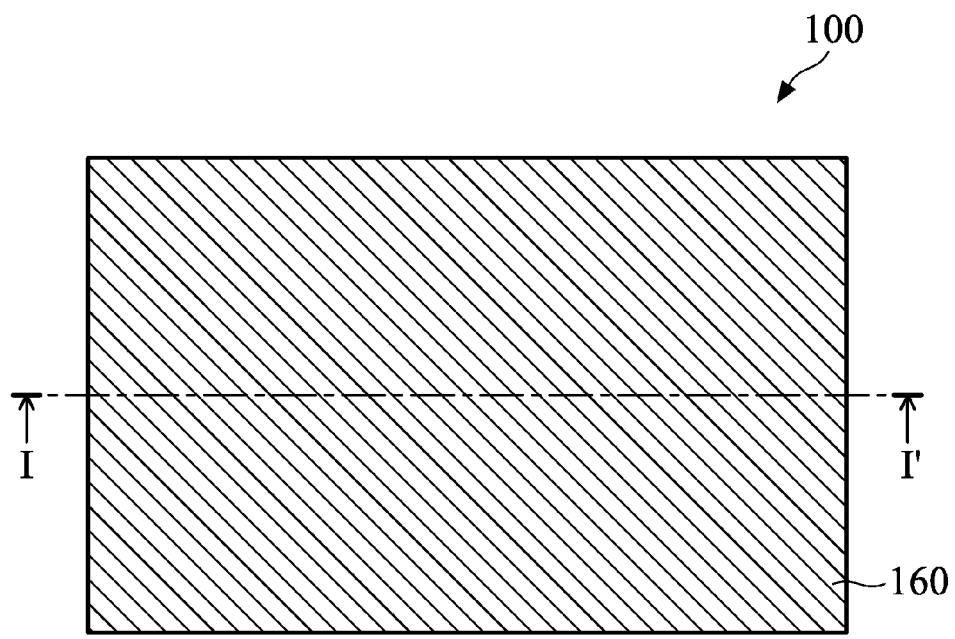
Figures 1, 1D, 2:
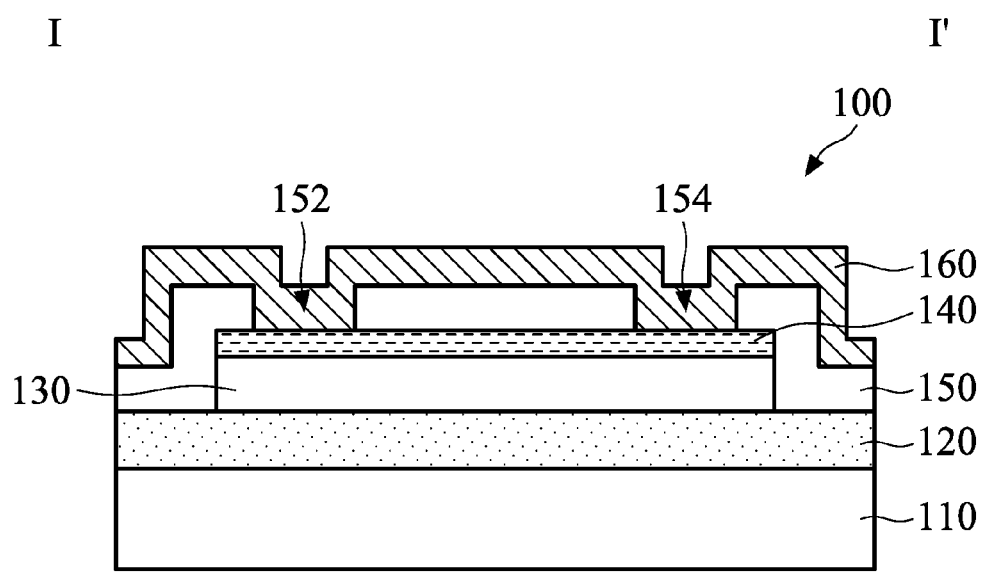
Figures 1, 1E:
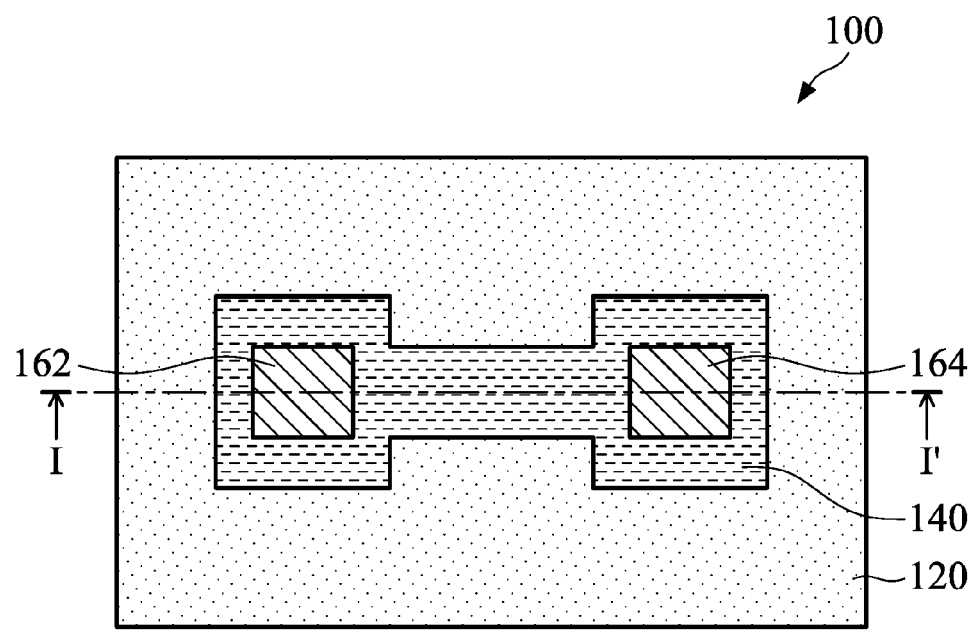
Figures 1, 1E, 2:
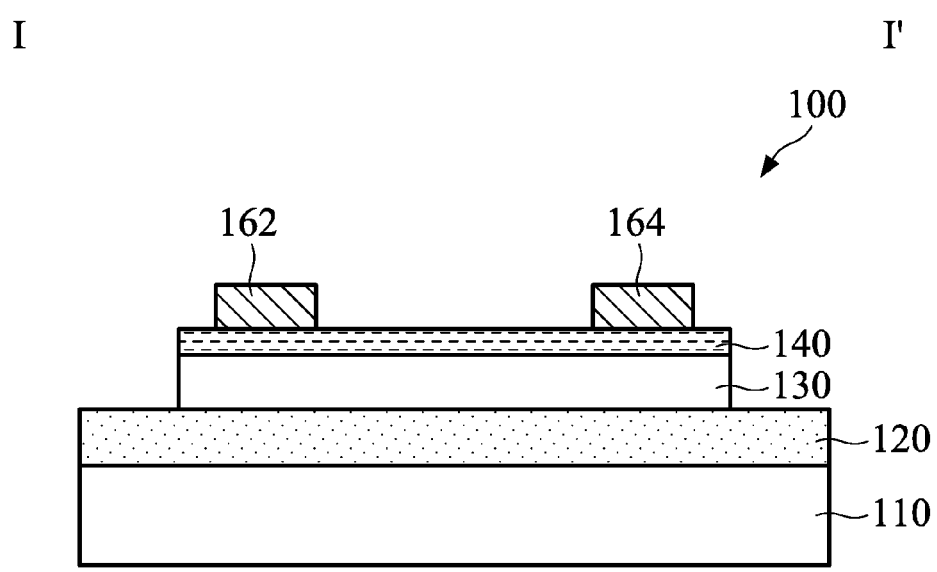
Figures 1, 1F:
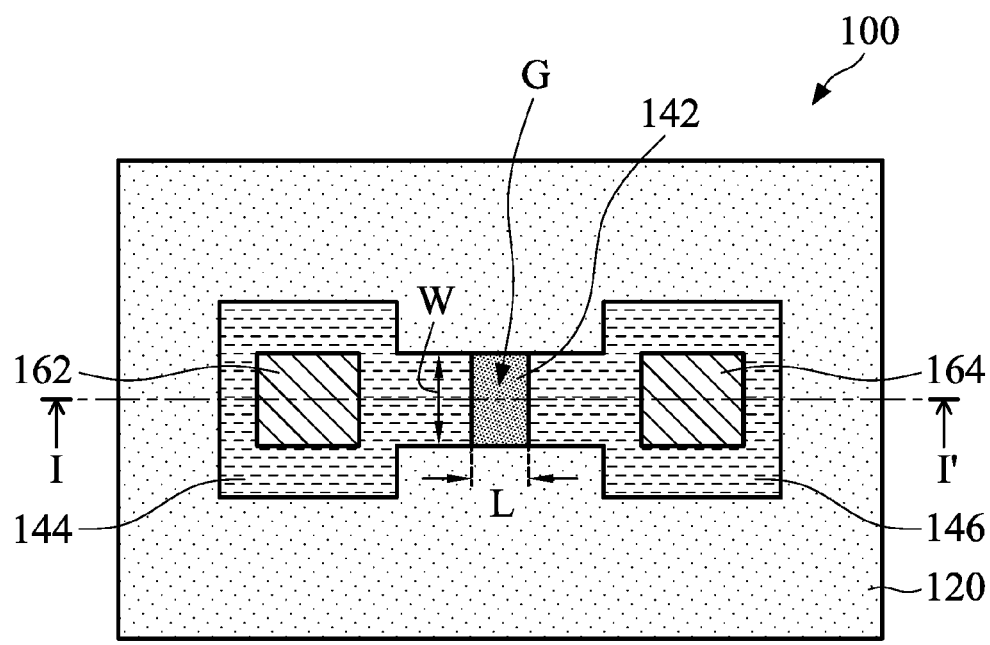
Figures 1, 1F, 2:
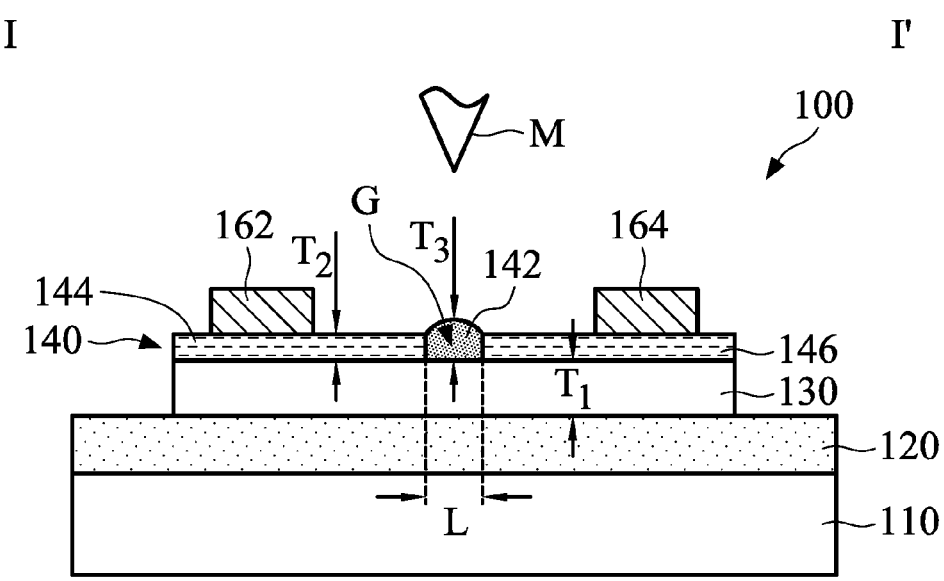
Figures 1, 1G:
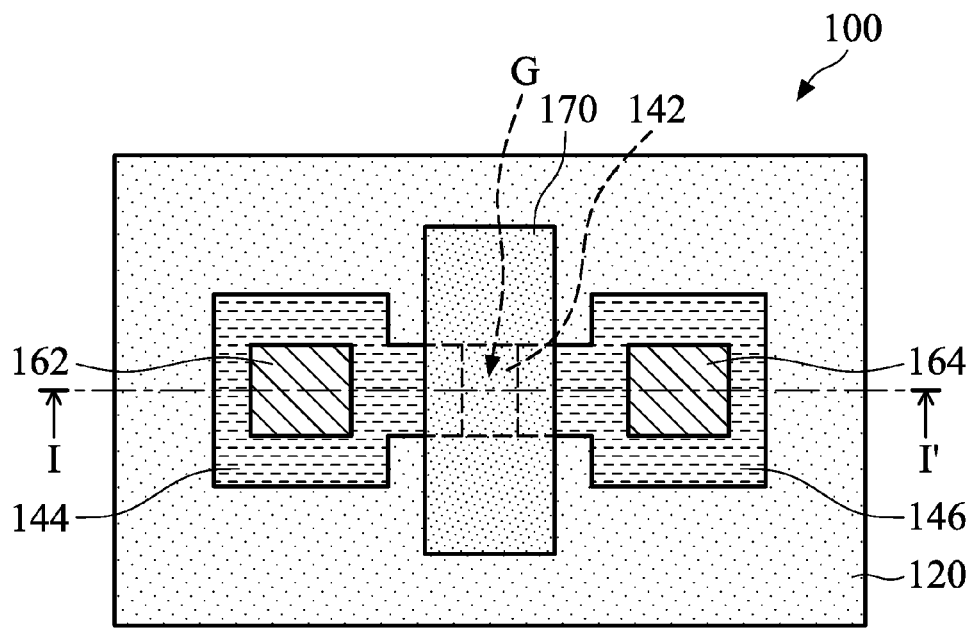
Figures 1, 1G, 2:
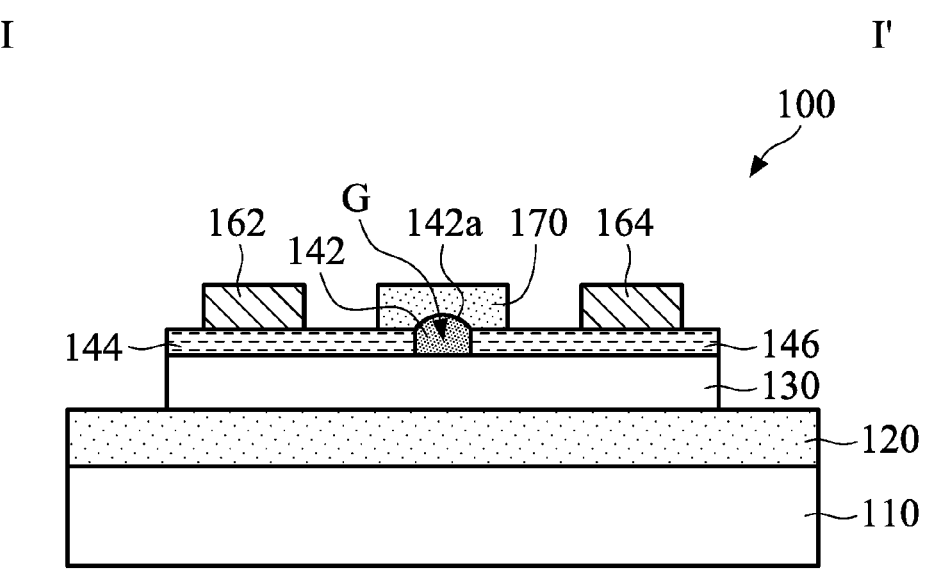
Figures 1, 1H:
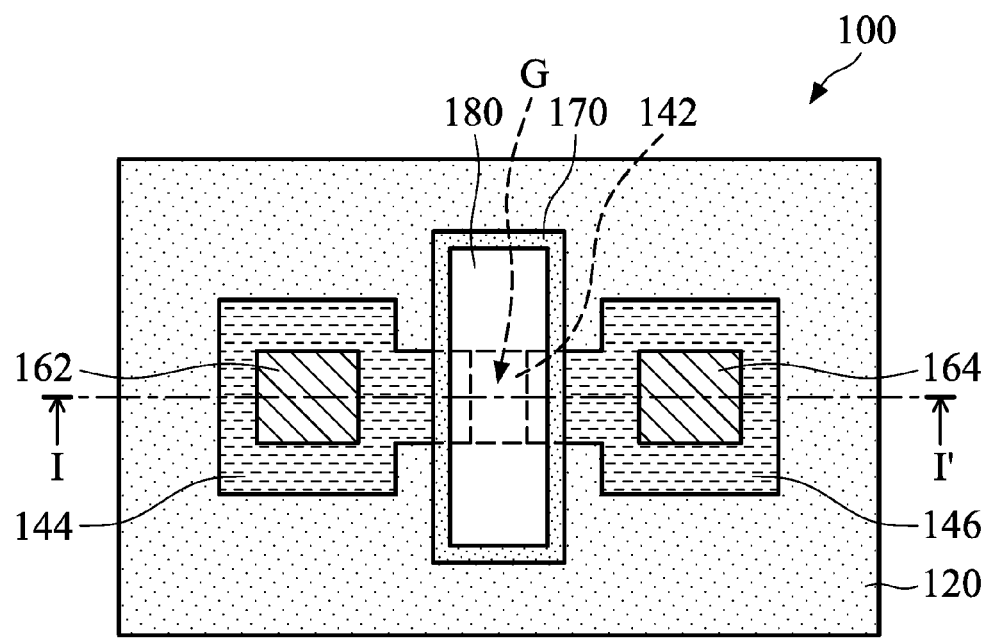
Figures 1, 1H, 2:
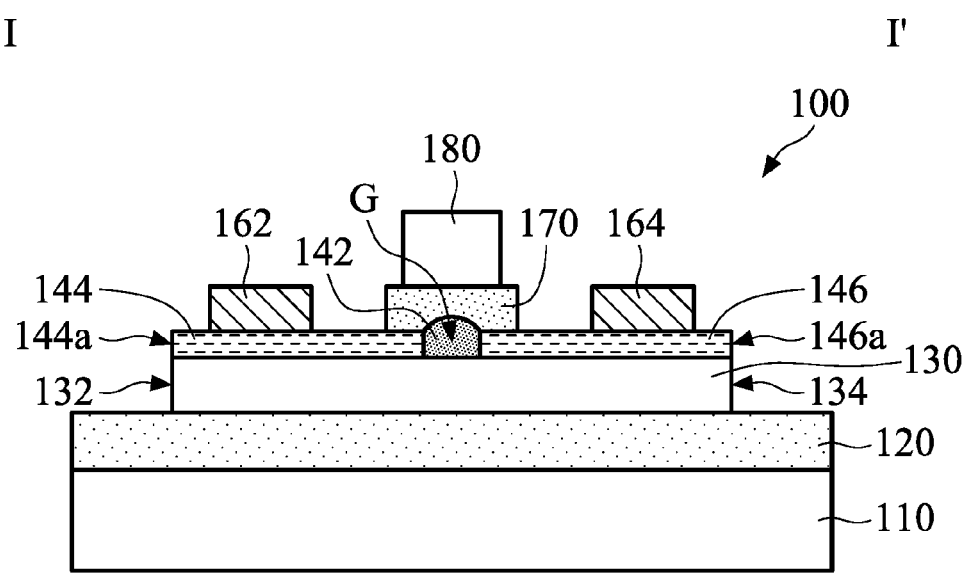

FIGS. 1A-1 to 1H-1 are top views of various stages of a process for forming a semiconductor device structure 100, in accordance with some embodiments. FIGS. 1A-2 to 1H-2 are cross-sectional views illustrating a semiconductor device structure 100 along a sectional line I-I' in FIGS. 1A-1 to 1H-1 respectively, in accordance with some embodiments.

As shown in FIGS. 1A-1 and 1A-2, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, device elements (not shown) are formed in the substrate 110, in accordance with some embodiments. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes. In some other embodiments, the substrate 110 includes a metal material, a glass material, or a polymer material.

As shown in FIGS. 1A-1 and 1A-2, an insulating layer 120 is formed over the substrate 110, in accordance with some embodiments. The insulating layer 120 includes an insulating material, in accordance with some embodiments. The insulating material includes silicon oxide or another suitable material, in accordance with some embodiments. The insulating layer 120 is formed using a chemical vapor deposition (CVD) process, a high density plasma chemical vapor deposition (HDP-CVD) process, a spin-on process, or a combination thereof, in accordance with some embodiments.

As shown in FIGS. 1A-1 and 1A-2, a semiconductor layer 130 is formed over the insulating layer 120, in accordance with some embodiments. The semiconductor layer 130 is in direct contact with the insulating layer 120, in accordance with some embodiments.

The semiconductor layer 130 includes a transition metal chalcogenide, in accordance with some embodiments. The transition metal chalcogenide includes a transition metal dichalcogenide (TMD), in accordance with some embodiments. The transition metal dichalcogenide has the general formula $MX_2$ where M is a transition metal (e.g., Mo, W, or Hf) and X is a chalcogenide (e.g., S, Se, or Te). Exemplary transition metal dichalcogenide includes $MoS_2$, $WS_2$, $HfS_2$, $MoCe_2$, $MoSe_2$, $WSe_2$, or $MoSe_2$. Here, Mo, Hf, W, S, Se, and Te are molybdenum, hafnium, tungsten, sulfur, selenium, and tellurium respectively.

The transition metal chalcogenide is a two-dimensional (2D) material, in accordance with some embodiments. Therefore, the semiconductor layer 130 includes one two-dimensional (2D) layer or a stack of two-dimensional (2D) layers, in accordance with some embodiments. The atoms of the 2D layer are held together via intra-layer covalent and/or ion bonds, i.e., strong chemical bonds, in accordance with some embodiments. Substantially weaker forces (e.g., van der Waals forces) hold adjacent 2D layers of the stack together, in accordance with some embodiments.

The semiconductor layer 130 includes one to thirty layers of transition metal chalcogenide, in accordance with some embodiments. The thickness $T_1$ of the semiconductor layer 130 ranges from about 0.65 nm to about 20 nm, in accordance with some embodiments. The semiconductor layer 130 is directly deposited on the insulating layer 120, in accordance with some embodiments. The semiconductor layer 130 is formed using a chemical vapor deposition process, a mechanical exfoliation process and a following film attachment process, or another suitable process, in accordance with some embodiments.

As shown in FIGS. 1A-1 and 1A-2, a graphene layer 140 is formed over the semiconductor layer 130, in accordance with some embodiments. The graphene layer 140 is in direct contact with the semiconductor layer 130, in accordance with some embodiments. The graphene layer 140 includes one to five layers of graphene, in accordance with some embodiments.

In some embodiments, a thickness $T_2$ of the graphene layer 140 ranges from about 4 Å to about 17 Å. In some embodiments, the thickness $T_2$ is less than the thickness $T_1$ of the semiconductor layer 130. The graphene layer 140 is directly deposited on the semiconductor layer 130, in accordance with some embodiments. The graphene layer 140 is formed using a chemical vapor deposition process, a mechanical exfoliation process and a following film attachment process, or another suitable deposition process, in accordance with some embodiments.

The contact resistance between graphene and transition metal chalcogenide is lower than that between metal and transition metal chalcogenide, in accordance with some embodiments. For example, the contact resistance between graphene and $MoS_2$ is $6.4*10^3$, and the contact resistance between gold and $MoS_2$ is $7.1*10^8$.

As shown in FIGS. 1B-1 and 1B-2, portions of the semiconductor layer 130 and the graphene layer 140 are removed, in accordance with some embodiments. The removal process includes a photolithography process and an etching process, in accordance with some embodiments. The removal process is also referred to as a patterning process, in accordance with some embodiments.

As shown in FIGS. 1C-1 and 1C-2, a mask layer 150 is formed over the insulating layer 120, the semiconductor layer 130, and the graphene layer 140, in accordance with some embodiments. The mask layer 150 has openings 152 and 154 exposing portions of the graphene layer 140, in accordance with some embodiments. The mask layer 150 includes a photoresist material, in accordance with some embodiments.

As shown in FIGS. 1D-1 and 1D-2, a conductive layer 160 is formed over the mask layer 150 and in the openings 152 and 154, in accordance with some embodiments. The conductive layer 160 is (electrically) connected to the graphene layer 140 exposed by the openings 152 and 154, in accordance with some embodiments. The conductive layer 160 is in direct contact with the graphene layer 140 exposed by the openings 152 and 154, in accordance with some embodiments.

The conductive layer 160 includes gold (Au), silver (Ag) or Aluminum (Al), in accordance with some embodiments. In some embodiments, the contact resistance between silver and graphene is 4.8 Ω*mm, and the contact resistance between gold and graphene is 20.1 Ω*mm. The contact resistance between silver (or gold) and graphene is lower than that between aluminum and graphene (642.5 Ω*mm), in accordance with some embodiments. The conductive layer 160 is formed using a physical vapor deposition process or another suitable process.

As shown in FIGS. 1E-1 and 1E-2, the mask layer 150 and the conductive layer 160 over the mask layer 150 are removed, in accordance with some embodiments. The removal process includes a lift-of process, in accordance with some embodiments. After the removal process, the remaining conductive layer 160 forms a first conductive structure 162 and a second conductive structure 164 over the graphene layer 140, in accordance with some embodiments.

As shown in FIGS. 1F-1 and 1F-2, an anode oxidation process is performed on a portion of the graphene layer 140 to oxidize the portion of the graphene layer 140 into an insulating layer 142, in accordance with some embodiments. The insulating layer 142 includes carbon and oxide, in accordance with some embodiments.

The insulating layer 142 defines and electrically isolates a source electrode 144 and a drain electrode 146 of the graphene layer 140, in accordance with some embodiments. The first conductive structure 162 and the second conductive structure 164 are located over and electrically connected to the source electrode 144 and the drain electrode 146, respectively, in accordance with some embodiments.

The source electrode 144 and the drain electrode 146 are spaced apart from each other by a gap G, in accordance with some embodiments. The insulating layer 142 is filled in the gap G and protrudes from the gap G, in accordance with some embodiments. The insulating layer 142 is thicker than the source electrode 144, in accordance with some embodiments. The insulating layer 142 is thicker than the drain electrode 146, in accordance with some embodiments.

That is, a thickness $T_3$ of the insulating layer 142 is greater than the thickness $T_2$ of the source electrode 144 or the drain electrode 146, in accordance with some embodiments. The difference between the thicknesses $T_3$ and $T_2$ ranges from about 1 nm to about 5 nm, in accordance with some embodiments. The thickness $T_1$ of the semiconductor layer 130 is greater than the thickness $T_3$ of the insulating layer 142, in accordance with some embodiments.

The gap G has a length L and a width W, in accordance with some embodiments. The length L is equal to a distance between the source electrode 144 and the drain electrode 146, in accordance with some embodiments. Therefore, the length L is also equal to a channel length of a channel in the semiconductor layer 130 under the gap G, in accordance with some embodiments. The width W is equal to a channel width of the channel in the semiconductor layer 130 under the gap G, in accordance with some embodiments. The width W is greater than the length L, in accordance with some embodiments.

The anode oxidation process includes an atomic force microscope anode oxidation process, in accordance with some embodiments. That is, the anode oxidation process uses an atomic force microscope (AFM) to oxidize the portion of the graphene layer 140, in accordance with some embodiments.

The atomic force microscope anode oxidation process positions an AFM probe M close to the portion of the graphene layer 140 and provides a voltage difference between the graphene layer 140 and the AFM probe M to oxidize the portion of the graphene layer 140, in accordance with some embodiments.

The tip of the AFM probe M has a width less than 10 nm, in accordance with some embodiments. Since the AFM probe M has the narrow tip, the length L is less than 10 nm as well, in accordance with some embodiments. The length L ranges from about 2 nm to about 7 nm, in accordance with some embodiments. The small length L improves the mobility and the performance of the semiconductor device structure 100, in accordance with some embodiments.

The anode oxidation process is performed under a relative humidity of 30% to 100%, in accordance with some embodiments. The anode oxidation process is performed in ambient including oxygen atoms, such as $O_2$, $O_3$, and/or $H_2O$, in accordance with some embodiments.

The semiconductor layer 130 is configured to provide a channel between the source electrode 144 and the drain electrode 146, in accordance with some embodiments. In some embodiments, the substrate 110 is configured to be a bottom gate electrode. In some other embodiments, a top gate electrode is formed over the channel between the source electrode 144 and the drain electrode 146, and the detailed description is described as follows.

As shown in FIGS. 1G-1 and 1G-2, a gate dielectric layer 170 is formed over the insulating layer 142, the source electrode 144, and the drain electrode 146, in accordance with some embodiments. The gate dielectric layer 170 covers the entire insulating layer 142 and portions of the source electrode 144 and the drain electrode 146 adjacent to the insulating layer 142, in accordance with some embodiments.

In some embodiments, a top portion 142a of the insulating layer 142 is embedded in the gate dielectric layer 170. The top portion 142a of the insulating layer 142 extends into the gate dielectric layer 170, in accordance with some embodiments. The gate dielectric layer 170 further covers a portion of the insulating layer 120, in accordance with some embodiments. The gate dielectric layer 170 covers the semiconductor layer 130 under the gap G (or the insulating layer 142), in accordance with some embodiments.

The gate dielectric layer 170 includes silicon oxide, silicon oxynitride, a combination thereof, or another suitable material. In some embodiments, the gate dielectric layer 170 includes a high dielectric constant material (high-k material), in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 170 is formed using a chemical vapor deposition process or another suitable process.

As shown in FIGS. 1H-1 and 1H-2, a gate electrode 180 is formed over the gate dielectric layer 170 above the gap G, in accordance with some embodiments. The gate electrode 180 is over the semiconductor layer 130 under the gap G (or the insulating layer 142), in accordance with some embodiments. The gate electrode 180 is configured to be a top gate electrode of the semiconductor device structure 100, in accordance with some embodiments.

The semiconductor device structure 100 may be a top-gate transistor or a dual-gate transistor, which has the top gate electrode 180 and the bottom gate electrode 110. As shown in FIGS. 1H-1 and 1H-2, a sidewall 144a of the source electrode 144 is aligned with a sidewall 132 of the semiconductor layer 130, in accordance with some embodiments. In some embodiments, a sidewall 146a of the drain electrode 146 is aligned with a sidewall 134 of the semiconductor layer 130.

Since the contact resistance between the source electrode 144 (or the drain electrode 146) and the semiconductor layer 130 is low, the performance of the semiconductor device structure 100 is improved. Similarly, since the contact resistance between the first conductive structure 162 and the source electrode 144 and between the second conductive structure 164 and the drain electrode 146 is low, the performance of the semiconductor device structure 100 is improved.

Figures 1, 2A:
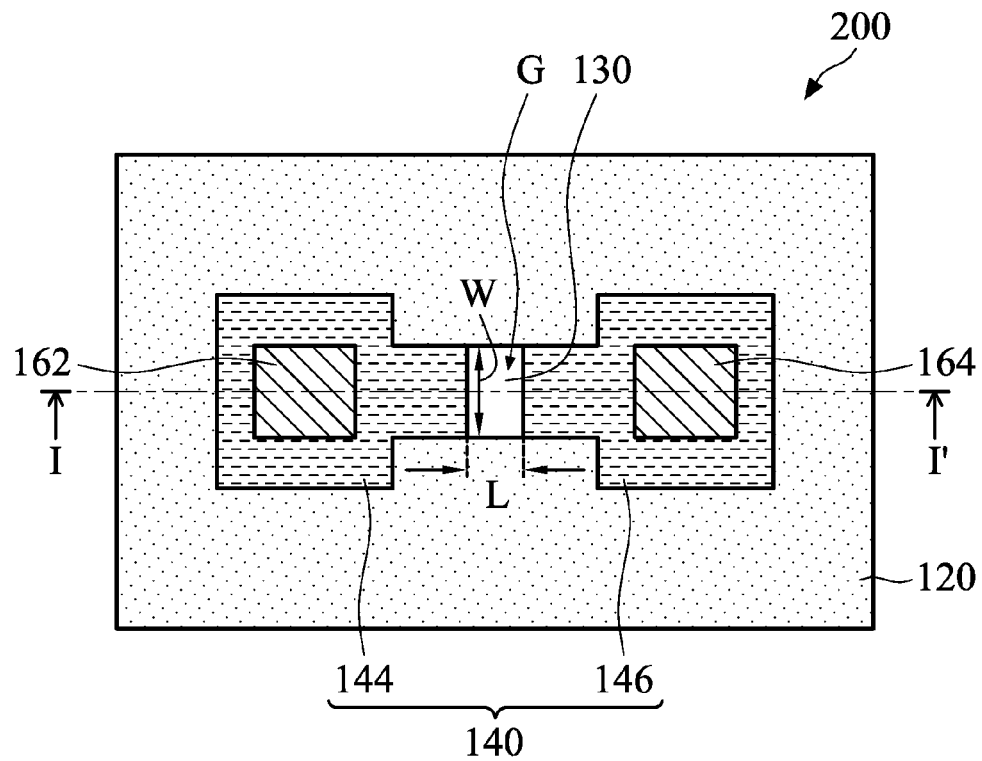
Figures 2, 2A:
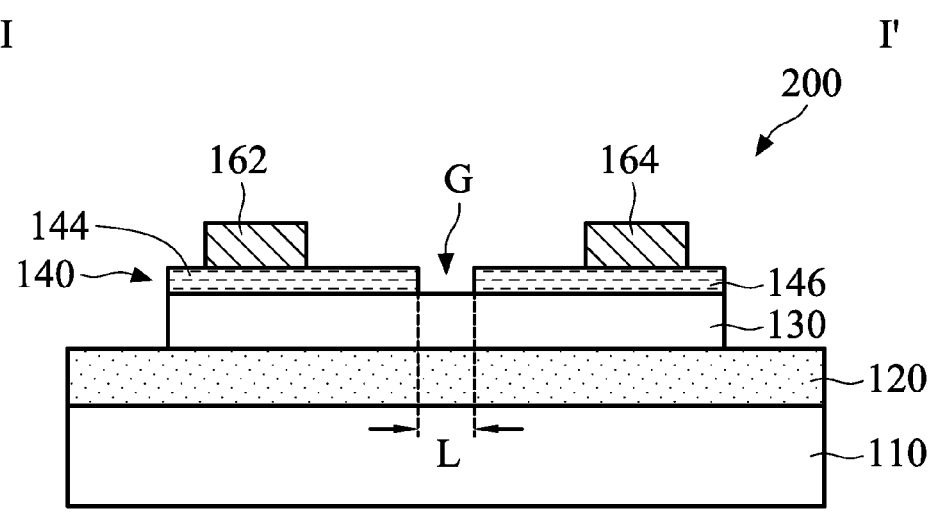
Figures 1, 2B:
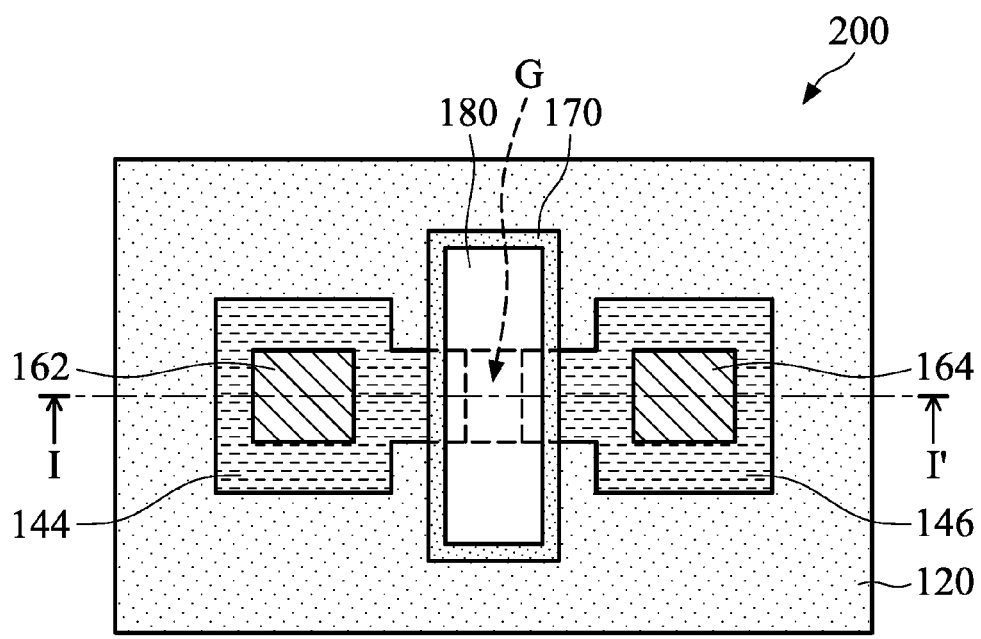
Figures 2, 2B:
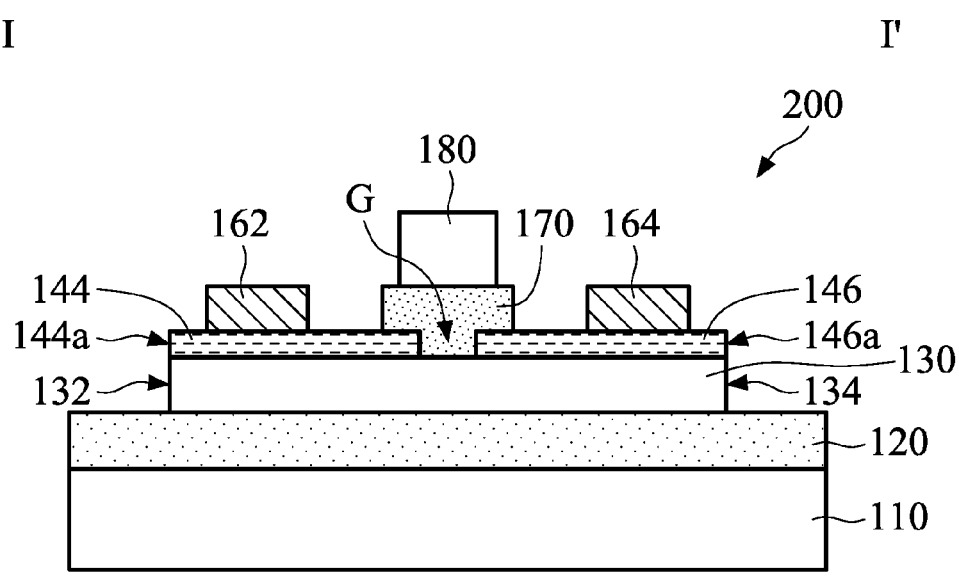

FIGS. 2A-1 to 2B-1 are top views of various stages of a process for forming a semiconductor device structure 200, in accordance with some embodiments. FIGS. 2A-2 to 2B-2 are cross-sectional views illustrating a semiconductor device structure 200 along a sectional line I-I' in FIGS. 2A-1 to 2B-1 respectively, in accordance with some embodiments.

After the step of FIGS. 1E-1 and 1E-2, as shown in FIGS. 2A-1 and 2A-2, a portion of the graphene layer 140 is removed, in accordance with some embodiments. After the removal process, a gap G is formed in the graphene layer 140, in accordance with some embodiments. The gap G exposes a portion of the semiconductor layer 130, in accordance with some embodiments. The gap G defines and electrically isolates a source electrode 144 and a drain electrode 146 of the graphene layer 140, in accordance with some embodiments.

The gap G has a length L and a width W, in accordance with some embodiments. The semiconductor layer 130 is configured to provide a channel between the source electrode 144 and the drain electrode 146, in accordance with some embodiments. The length L is equal to a distance between the source electrode 144 and the drain electrode 146, in accordance with some embodiments.

Therefore, the length L is also equal to a channel length of the channel in the semiconductor layer 130 under the gap G, in accordance with some embodiments. The width W is equal to a channel width of the channel in the semiconductor layer 130 under the gap G, in accordance with some embodiments. The width W is greater than the length L, in accordance with some embodiments.

The removal process includes an ion beam etching process, in accordance with some embodiments. The ion beam etching process includes a helium ion beam etching process, a focused ion beam etching process, or another suitable ion beam etching process. The removal process includes an electron beam lithography (EBL) process and an etching process, in accordance with some embodiments.

Since the ion beam etching process or the electron beam lithography process is able to form a fine pattern, the length L (or the channel length) is less than 10 nm. The small length L improves the mobility and the performance of the semiconductor device structure 200, in accordance with some embodiments.

In some embodiments, the substrate 110 is configured to be a bottom gate electrode. In some other embodiments, a top gate electrode is formed over the channel between the source electrode 144 and the drain electrode 146, and the detailed description is described as follows.

After the steps of FIGS. 1G-1, 1G-2, 1H-1, and 1H-2, as shown in FIGS. 2B-1 and 2B-2, a gate dielectric layer 170 is formed over the semiconductor layer 130 exposed by the gap G, the source electrode 144, and the drain electrode 146, in accordance with some embodiments. The gate dielectric layer 170 fills the entire gap G and covers portions of the source electrode 144 and the drain electrode 146 adjacent to the gap G, in accordance with some embodiments. The gate dielectric layer 170 further covers a portion of the insulating layer 120, in accordance with some embodiments.

The gate dielectric layer 170 includes silicon oxide, silicon oxynitride, a combination thereof, or another suitable material. In some embodiments, the gate dielectric layer 170 includes a high dielectric constant material (high-k material), in accordance with some embodiments.

The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 170 is formed using a chemical vapor deposition process or another suitable process.

As shown in FIGS. 2B-1 and 2B-2, a gate electrode 180 is formed over the gate dielectric layer 170 over the gap G, in accordance with some embodiments. The gate electrode 180 is over the semiconductor layer 130 exposed by the gap G, in accordance with some embodiments. The gate electrode 180 is configured to be a top gate electrode of the semiconductor device structure 200, in accordance with some embodiments. The semiconductor device structure 200 may be a top-gate transistor or a dual-gate transistor, which has the top gate electrode 180 and the bottom gate electrode 110.

As shown in FIGS. 2B-1 and 2B-2, a sidewall 144a of the source electrode 144 is aligned with a sidewall 132 of the semiconductor layer 130, in accordance with some embodiments. In some embodiments, a sidewall 146a of the drain electrode 146 is aligned with a sidewall 134 of the semiconductor layer 130.

Figures 1, 3A:
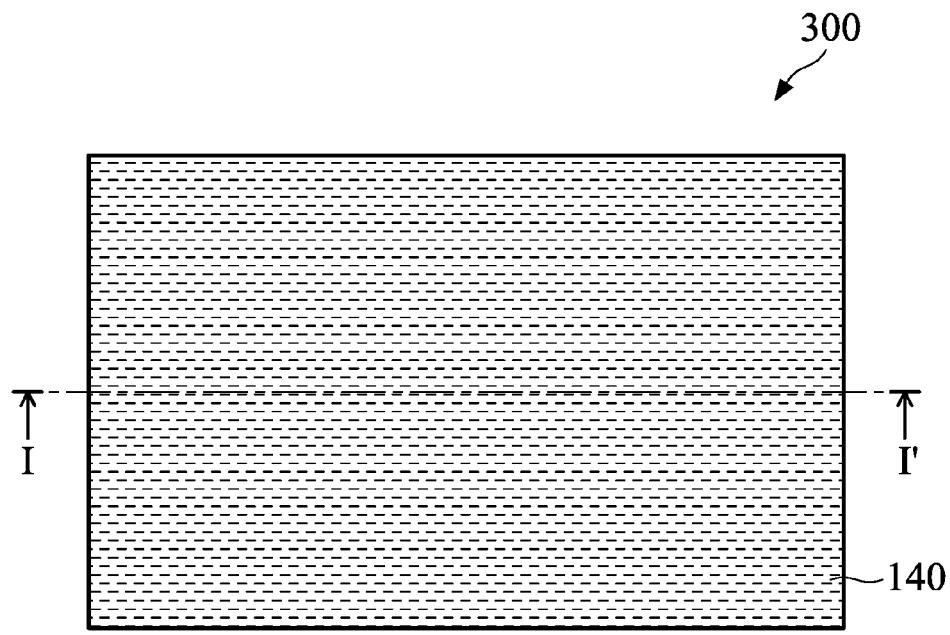
Figures 2, 3A:
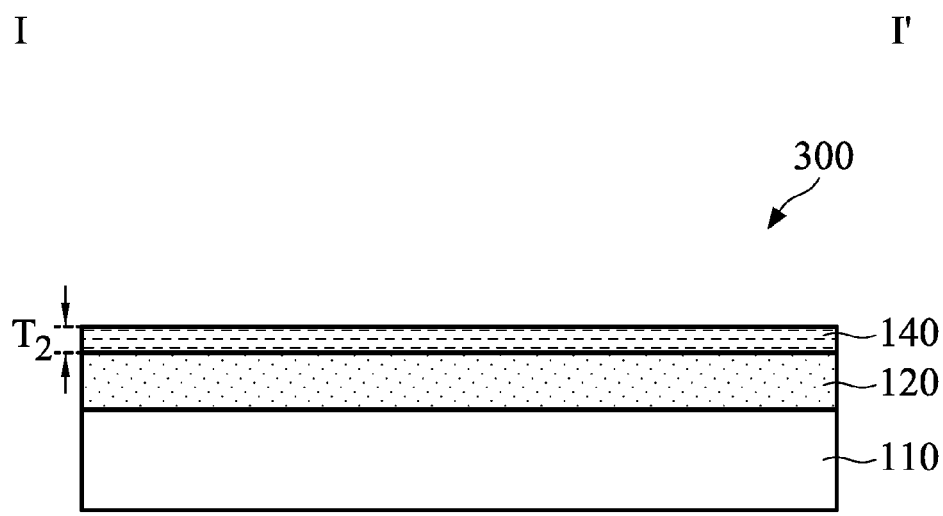
Figures 1, 3B:
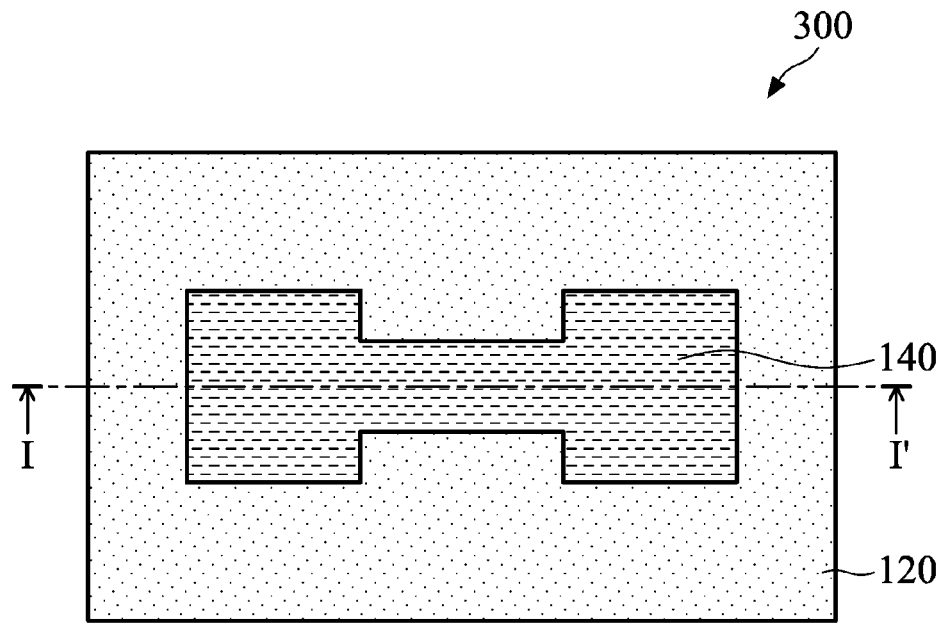
Figures 2, 3B:
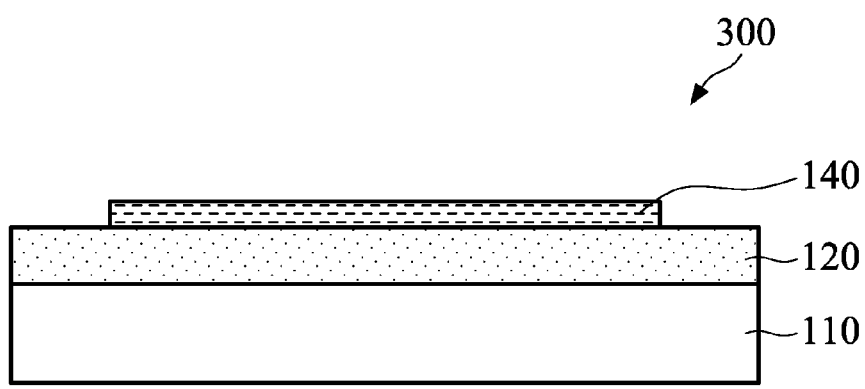
Figures 1, 3C:
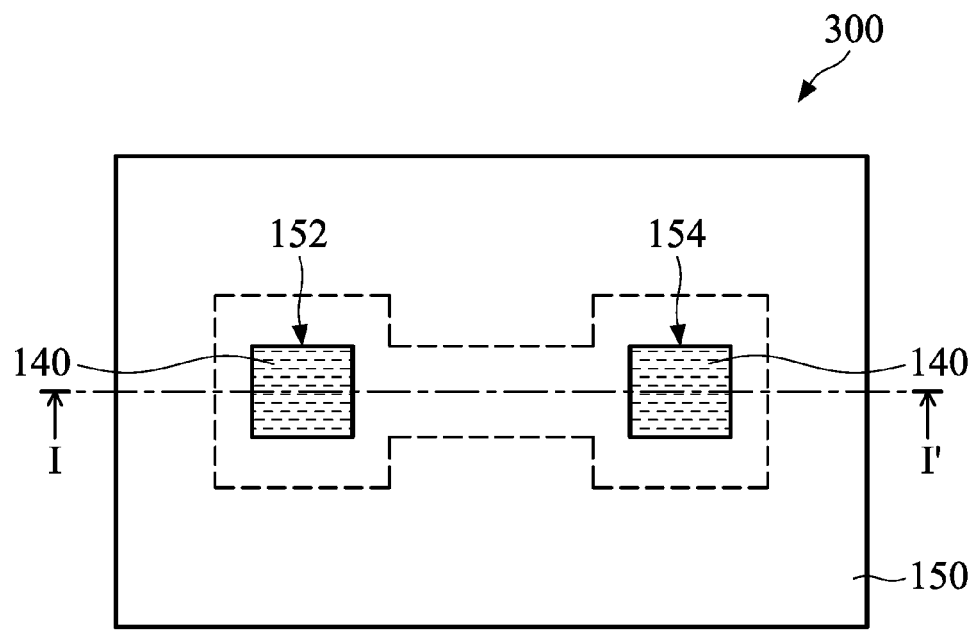
Figures 2, 3C:
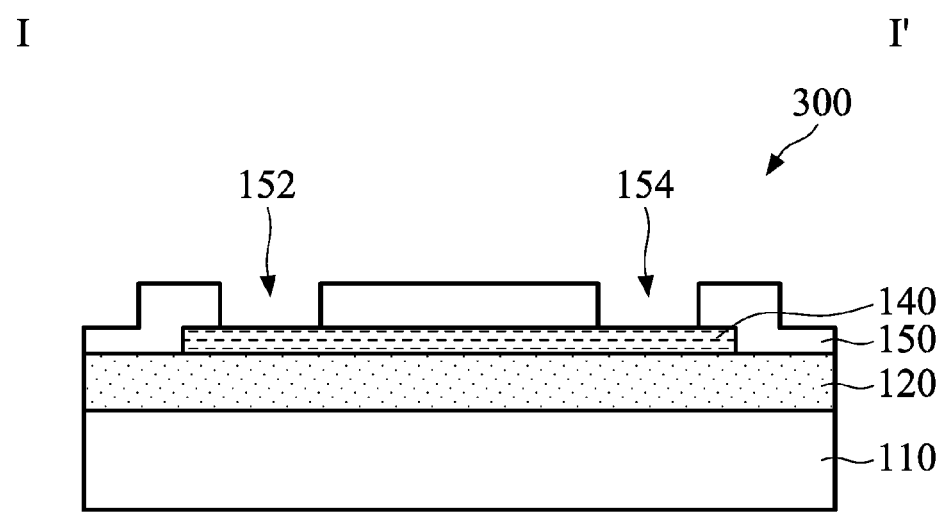
Figures 1, 3D:
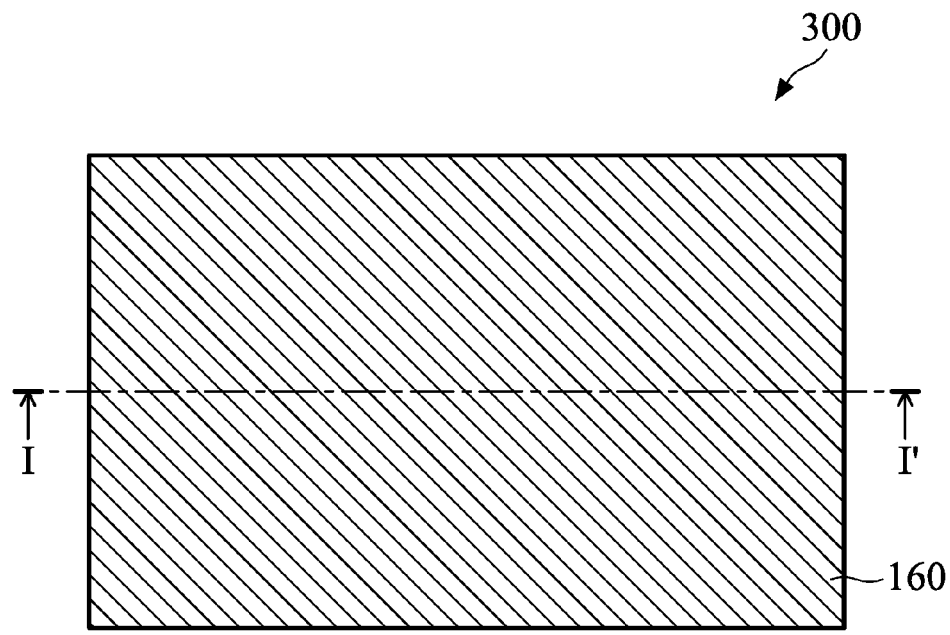
Figures 2, 3D:
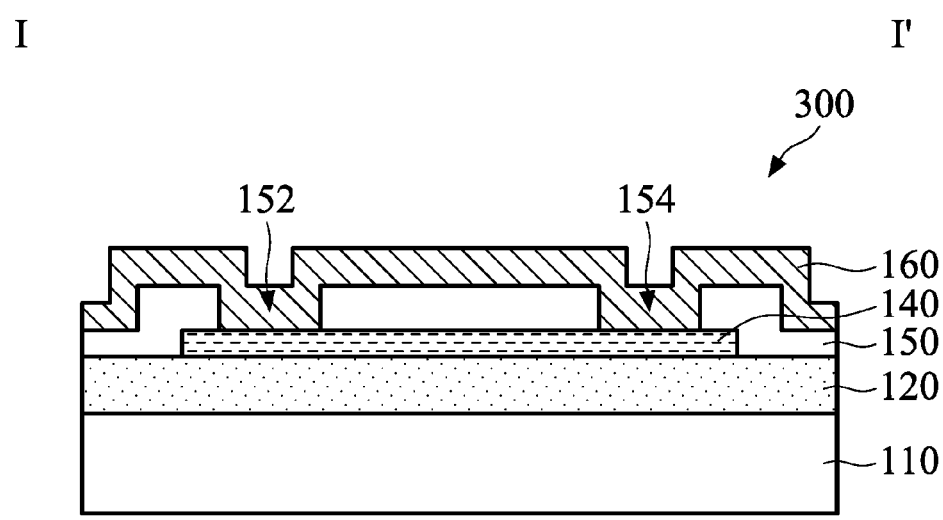
Figures 1, 3E:
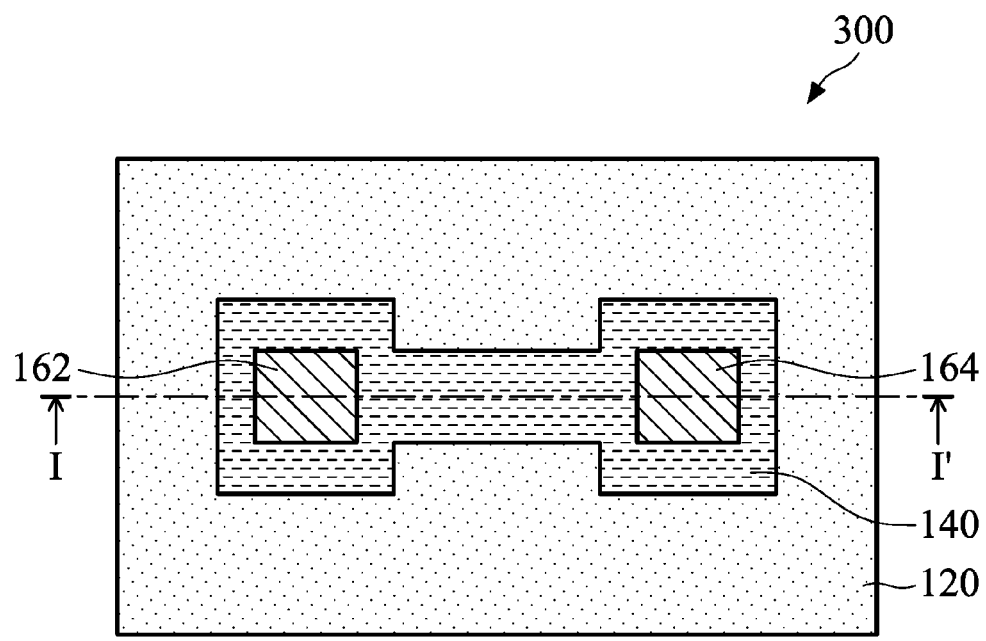
Figures 2, 3E:
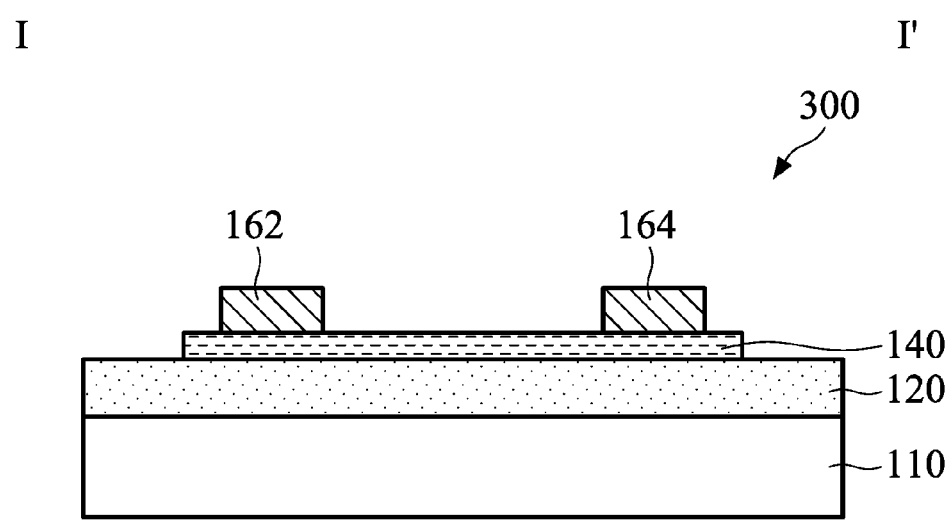
Figures 1, 3F:
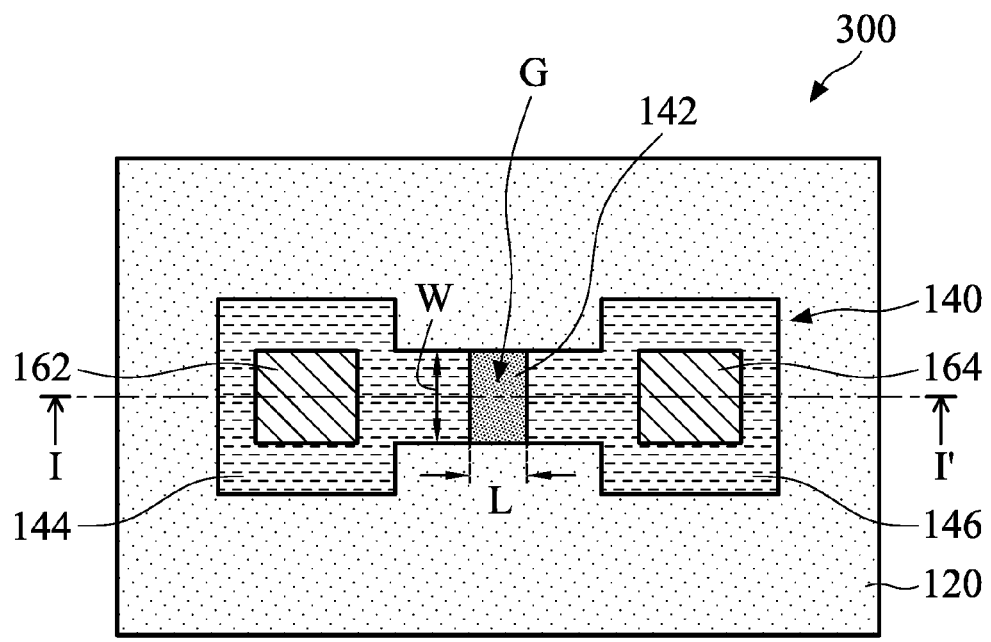
Figures 2, 3F:
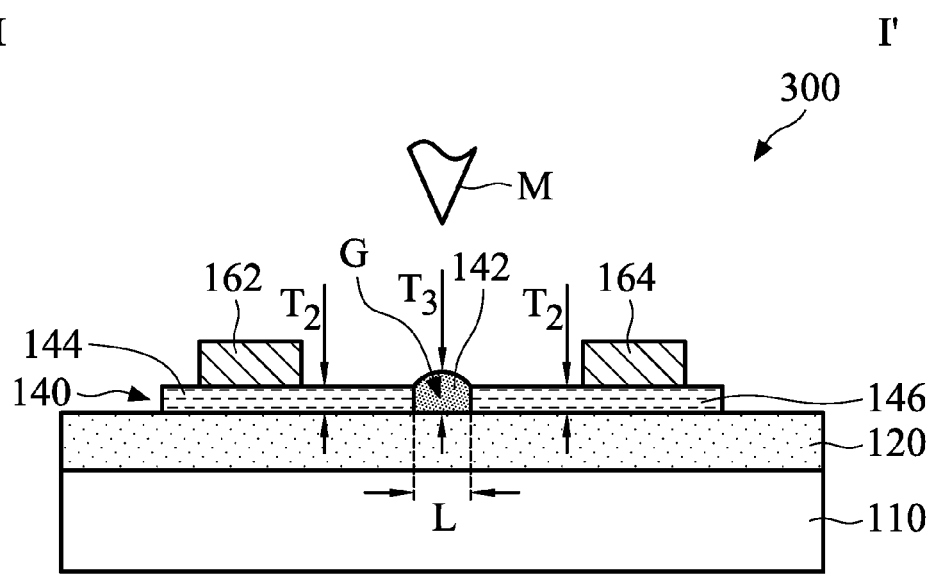
Figures 1, 3G:
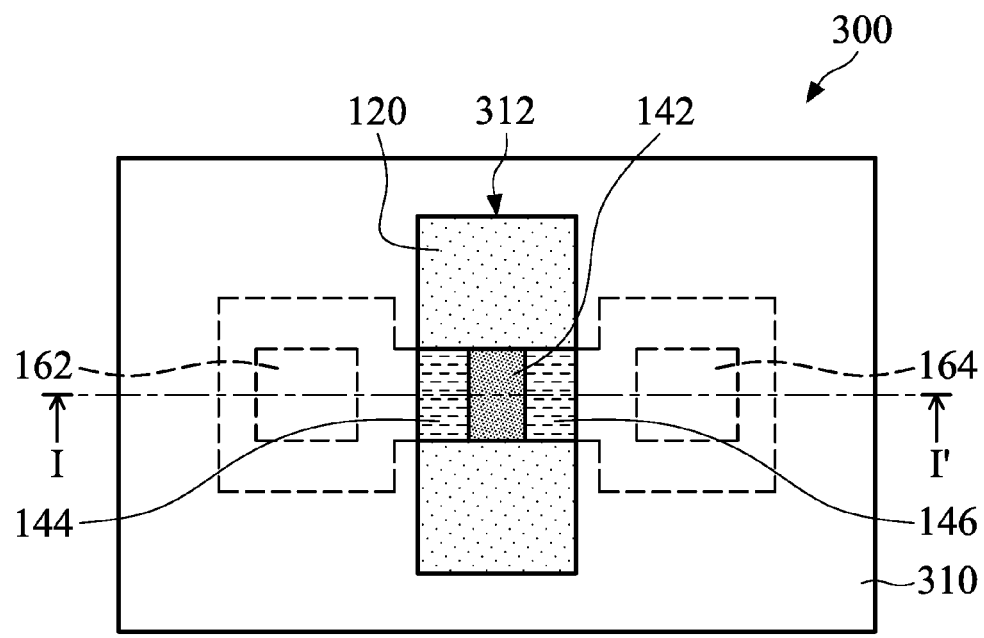
Figures 2, 3G:
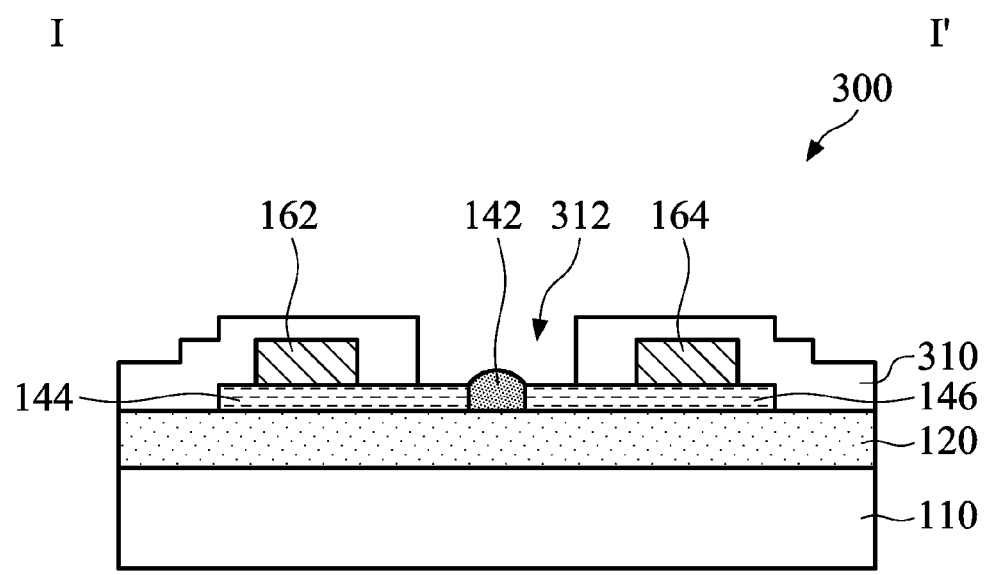
Figures 1, 3H:
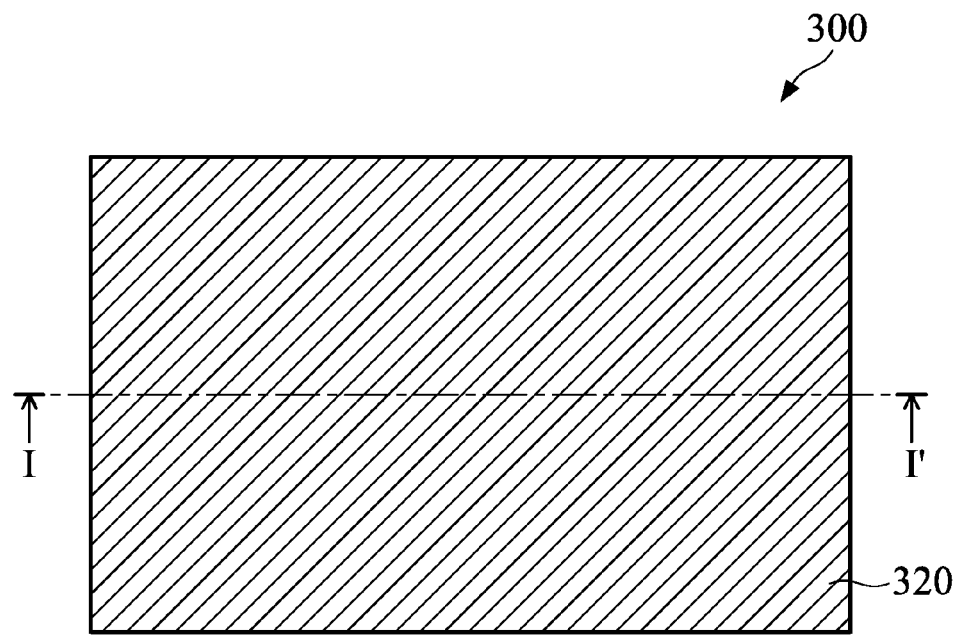
Figures 2, 3H:
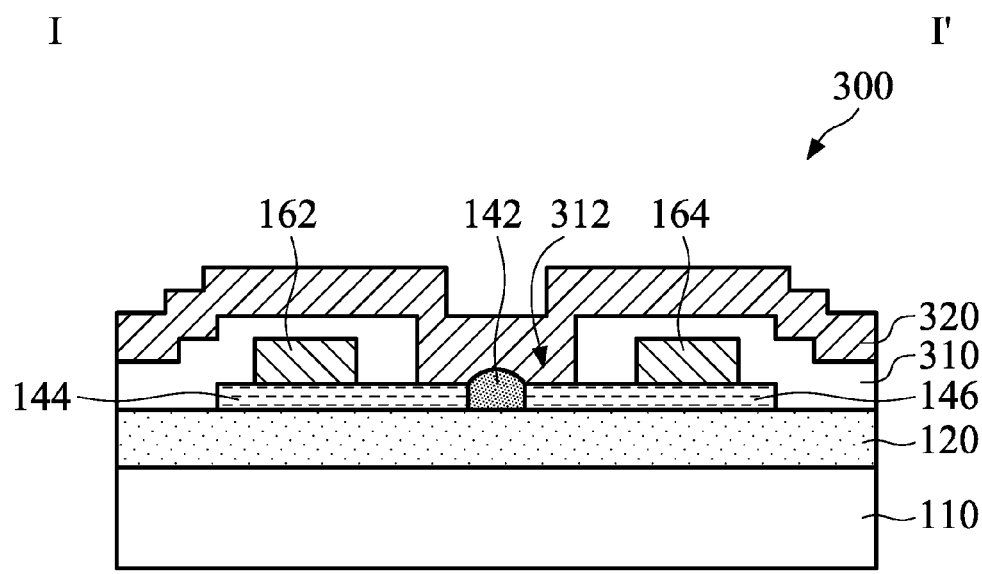
Figures 1, 3I:
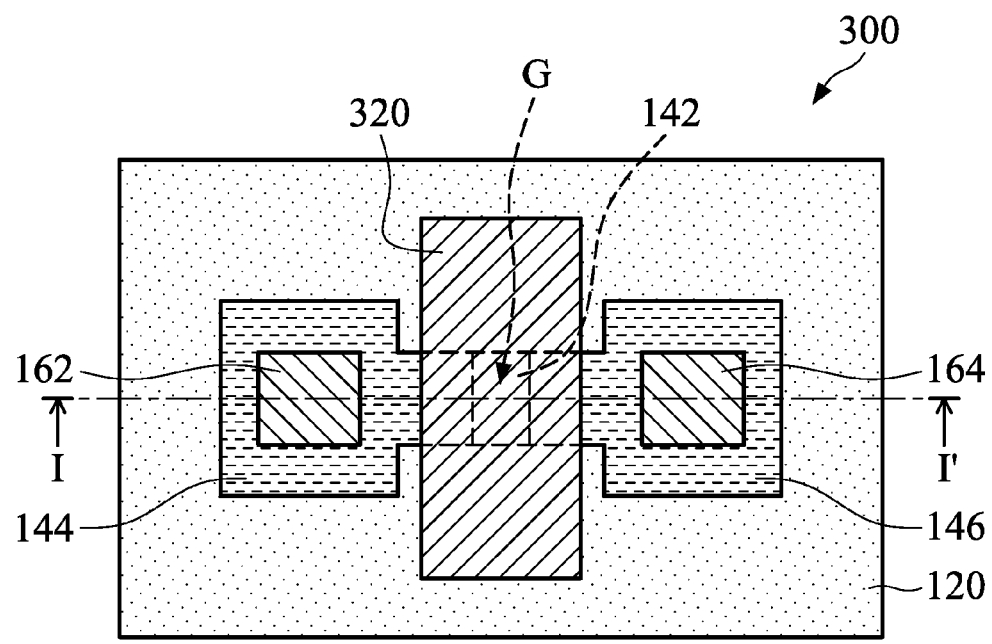
Figures 2, 3I:
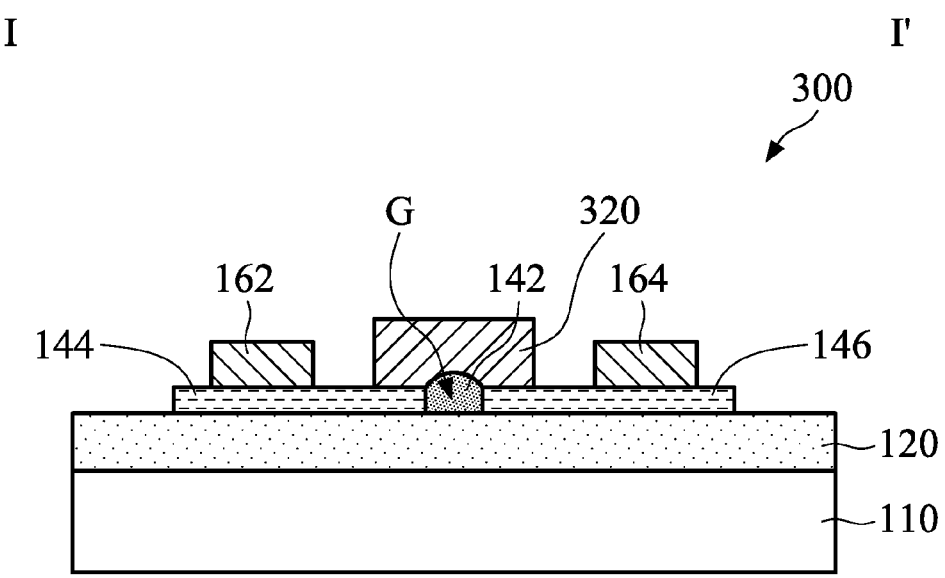
Figures 1, 3J:
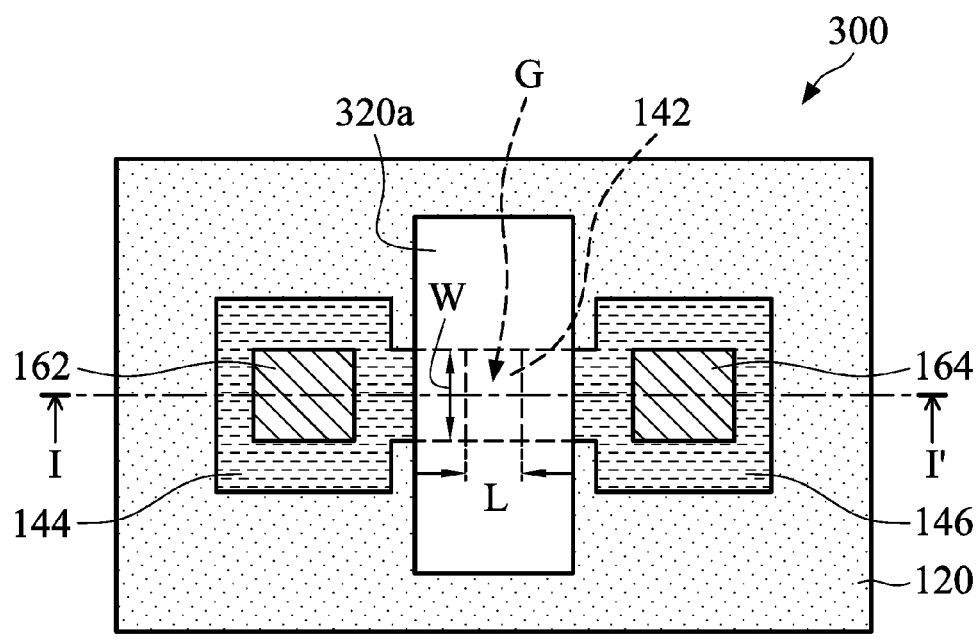
Figures 2, 3J:
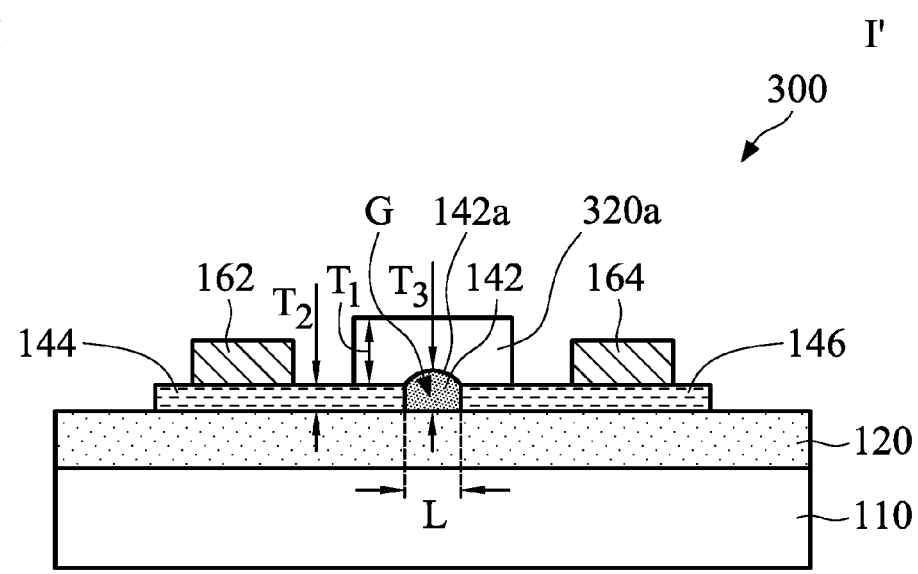
Figures 1, 3K:
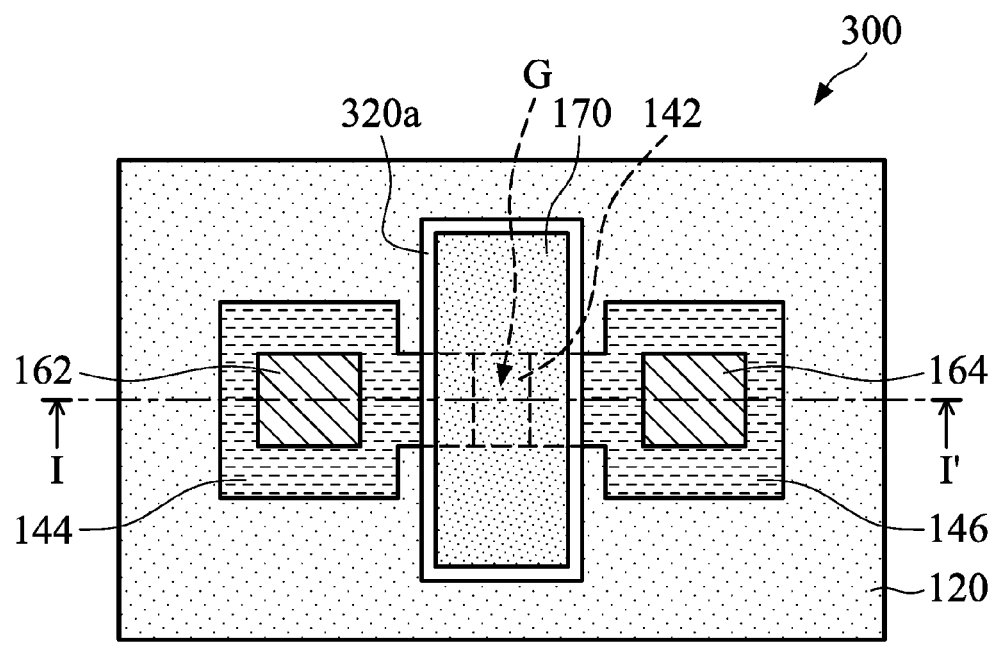
Figures 2, 3K:
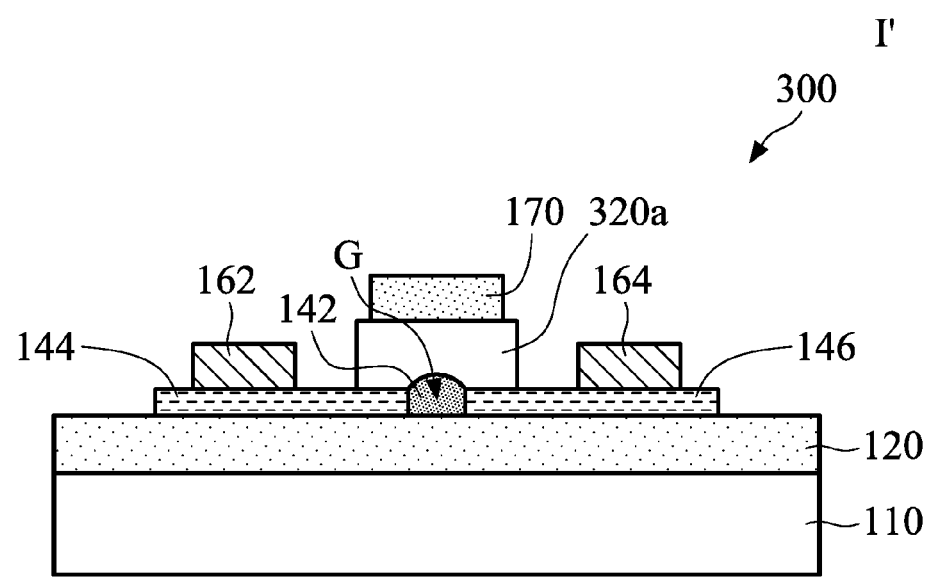
Figures 1, 3L:
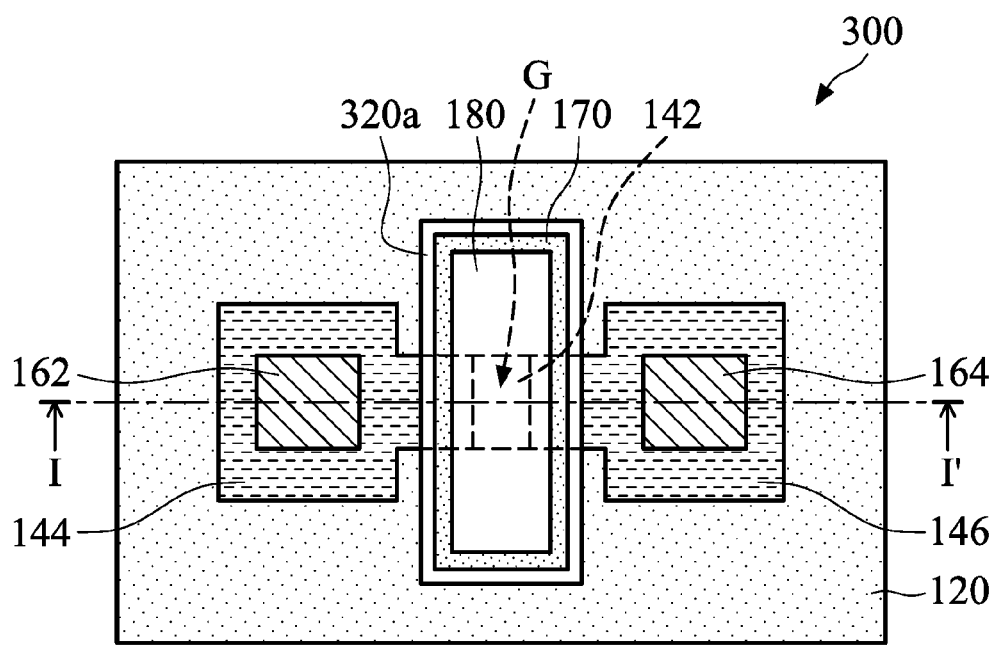
Figures 2, 3L:
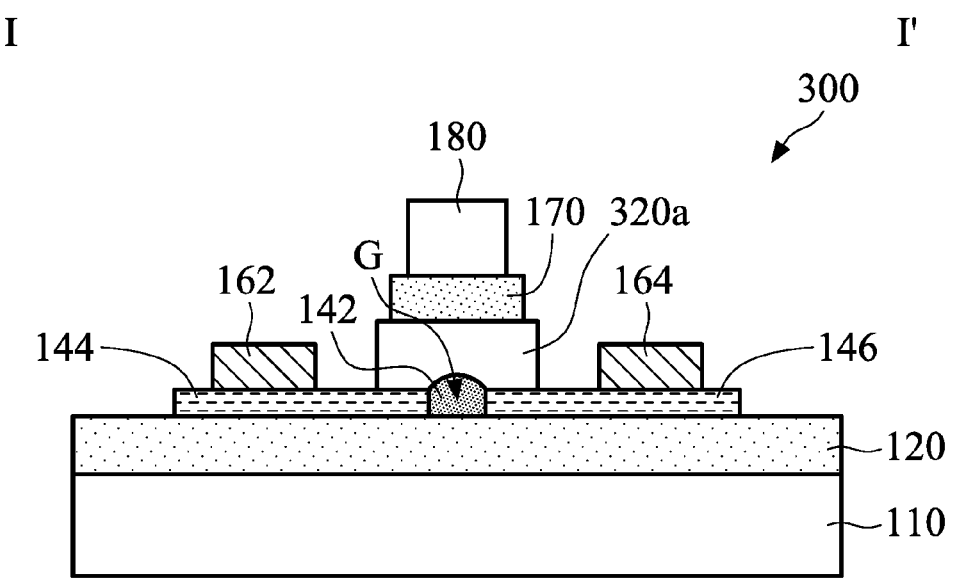

FIGS. 3A-1 to 3L-1 are top views of various stages of a process for forming a semiconductor device structure 300, in accordance with some embodiments. FIGS. 3A-2 to 3L-2 are cross-sectional views illustrating a semiconductor device structure 300 along a sectional line I-I' in FIGS. 3A-1 to 3L-1 respectively, in accordance with some embodiments.

In FIGS. 3A-1 to 3L-1 and 3A-2 to 3L-2, elements designed by the same reference numbers as those in FIGS. 1A-1 to 1H-1 and 1A-2 to 1H-2 may have the same materials and the same or similar manufacturing methods as those in FIGS. 1A-1 to 1H-1 and 1A-2 to 1H-2.

As shown in FIGS. 3A-1 and 3A-2, a substrate 110 is provided, in accordance with some embodiments. In some embodiments, an insulating layer 120 is formed over the substrate 110. In some embodiments, a graphene layer 140 is formed over the insulating layer 120. The graphene layer 140 is in direct contact with the insulating layer 120, in accordance with some embodiments. The graphene layer 140 includes one to five layers of graphene, in accordance with some embodiments.

In some embodiments, a thickness $T_2$ of the graphene layer 140 ranges from about 4 Å to about 17 Å. The graphene layer 140 is directly deposited on the insulating layer 120, in accordance with some embodiments. The graphene layer 140 is formed using a chemical vapor deposition process, a mechanical exfoliation process and a following film attachment process, or another suitable process, in accordance with some embodiments.

As shown in FIGS. 3B-1 and 3B-2, a portion of the graphene layer 140 is removed, in accordance with some embodiments. The removal process includes a photolithography process and an etching process, in accordance with some embodiments. The removal process is also referred to as a patterning process, in accordance with some embodiments.

As shown in FIGS. 3C-1 and 3C-2, a mask layer 150 is formed over the insulating layer 120 and the graphene layer 140, in accordance with some embodiments. The mask layer 150 has openings 152 and 154 exposing portions of the graphene layer 140, in accordance with some embodiments. The mask layer 150 includes a photoresist material, in accordance with some embodiments.

As shown in FIGS. 3D-1 and 3D-2, a conductive layer 160 is formed over the mask layer 150 and the graphene layer 140 exposed by the openings 152 and 154, in accordance with some embodiments. The conductive layer 160 includes gold (Au), silver (Ag) or Aluminum (Al), in accordance with some embodiments. The conductive layer 160 is formed using a physical vapor deposition process or another suitable process.

As shown in FIGS. 3E-1 and 3E-2, the mask layer 150 and the conductive layer 160 over the mask layer 150 are removed, in accordance with some embodiments. The removal process includes a lift-of process, in accordance with some embodiments. After the removal process, the remaining conductive layer 160 forms a first conductive structure 162 and a second conductive structure 164 over the graphene layer 140, in accordance with some embodiments.

As shown in FIGS. 3F-1 and 3F-2, an anode oxidation process is performed on a portion of the graphene layer 140 to oxidize the portion of the graphene layer 140 into an insulating layer 142, in accordance with some embodiments. The insulating layer 142 includes carbon and oxide, in accordance with some embodiments.

The insulating layer 142 defines and electrically isolates a source electrode 144 and a drain electrode 146 of the graphene layer 140, in accordance with some embodiments. The first conductive structure 162 is located over and electrically connected to the source electrode 144, in accordance with some embodiments. The second conductive structure 164 is located over and electrically connected to the drain electrode 146, in accordance with some embodiments.

The source electrode 144 and the drain electrode 146 are spaced apart from each other by a gap G, in accordance with some embodiments. The insulating layer 142 is filled in the gap G and protrudes from the gap G, in accordance with some embodiments. The insulating layer 142 is thicker than the source electrode 144 or the drain electrode 146, in accordance with some embodiments. That is, a thickness $T_3$ of the insulating layer 142 is greater than the thickness $T_2$ of the source electrode 144 or the drain electrode 146, in accordance with some embodiments.

The difference between the thicknesses $T_3$ and $T_2$ ranges from about 1 nm to about 5 nm, in accordance with some embodiments. The gap G has a length L and a width W, in accordance with some embodiments. The length L is equal to a distance between the source electrode 144 and the drain electrode 146, in accordance with some embodiments. The width W is greater than the length L, in accordance with some embodiments.

The anode oxidation process includes an atomic force microscope anode oxidation process, in accordance with some embodiments. That is, the anode oxidation process uses an atomic force microscope (AFM) to oxidize the portion of the graphene layer 140, in accordance with some embodiments. The atomic force microscope anode oxidation process positions an AFM probe M close to the portion of the graphene layer 140 and provides a voltage difference between the graphene layer 140 and the AFM probe M to oxidize the portion of the graphene layer 140, in accordance with some embodiments.

The tip of the AFM probe M has a width less than 10 nm, in accordance with some embodiments. Since the AFM probe M has the narrow tip, the length L is less than 10 nm as well, in accordance with some embodiments. The length L ranges from about 2 nm to about 7 nm, in accordance with some embodiments. The small length L improves the mobility and the performance of the semiconductor device structure 300, in accordance with some embodiments.

The anode oxidation process is performed under a relative humidity of 30% to 100%, in accordance with some embodiments. The anode oxidation process is performed in ambient including oxygen atoms, such as $O_2$, $O_3$, and/or $H_2O$, in accordance with some embodiments.

As shown in FIGS. 3G-1 and 3G-2, a mask layer 310 is formed over the insulating layer 120, the source electrode 144, the drain electrode 146, the first conductive structure 162, and the second conductive structure 164, in accordance with some embodiments. The mask layer 310 has and opening 312 exposing the insulating layer 142 and portions of the source electrode 144, the drain electrode 146, and the insulating layer 120, in accordance with some embodiments.

The mask layer 310 includes a photoresist material, in accordance with some embodiments.

As shown in FIGS. 3H-1 and 3H-2, a transition metal layer 320 is formed over the mask layer 310 and in the opening 312, in accordance with some embodiments. The transition metal layer 320 includes a transition metal material, such as Mo, W, or Hf. The transition metal layer 320 is directly deposited on the insulating layer 142 and portions of the source electrode 144, the drain electrode 146, and the insulating layer 120 exposed by the opening 312, in accordance with some embodiments. The transition metal layer 320 is formed by a physical vapor deposition process or another suitable deposition process.

As shown in FIGS. 3I-1 and 3I-2, the mask layer 310 and the transition metal layer 320 over the mask layer 310 are removed, in accordance with some embodiments. The remaining transition metal layer 320 covers the insulating layer 142 and the portions of the source electrode 144, the drain electrode 146, and the insulating layer 120 adjacent to the insulating layer 142, in accordance with some embodiments. The remaining transition metal layer 320 is in direct contact with the insulating layer 142 and the portions of the source electrode 144, the drain electrode 146, and the insulating layer 120 adjacent to the insulating layer 142, in accordance with some embodiments As shown in FIGS. 3J-1 and 3J-2, a sulfurization process, a selenization process, or a telluridation process is performed on the transition metal layer 320 to convert the transition metal layer 320 into a semiconductor layer 320a, in accordance with some embodiments. The semiconductor layer 320a covers the entire gap G, in accordance with some embodiments.

The semiconductor layer 320a covers the entire insulating layer 142, in accordance with some embodiments. The semiconductor layer 320a further covers the portions of the source electrode 144, the drain electrode 146, and the insulating layer 120 adjacent to the insulating layer 142, in accordance with some embodiments.

The semiconductor layer 320a is in direct contact with the insulating layer 142, the portions of the source electrode 144, the drain electrode 146, and the insulating layer 120 adjacent to the insulating layer 142, in accordance with some embodiments. In some embodiments, a top portion 142a of the insulating layer 142 is embedded in the semiconductor layer 320a. That is, the top portion 142a of the insulating layer 142 extends into the semiconductor layer 320a, in accordance with some embodiments.

The semiconductor layer 320a includes a transition metal chalcogenide, in accordance with some embodiments. The transition metal chalcogenide includes a transition metal dichalcogenide (TMD), in accordance with some embodiments. The transition metal dichalcogenide has the general formula $MX_2$ where M is a transition metal (e.g., Mo, W, or Hf) and X is a chalcogenide (e.g., S, Se, or Te). Exemplary transition metal dichalcogenide includes $MoS_2$, $WS_2$, $HfS_2$, $MoCe_2$, $MoSe_2$, $WSe_2$, or $MoSe_2$.

The transition metal chalcogenide is a two-dimensional (2D) material, in accordance with some embodiments. Therefore, the semiconductor layer 320a includes one two-dimensional (2D) layer or a stack of two-dimensional (2D) layers (not shown), in accordance with some embodiments.

The semiconductor layer 320a includes one to thirty layers of transition metal chalcogenide, in accordance with some embodiments. The thickness $T_1$ of the semiconductor layer 320a ranges from about 0.65 nm to about 20 nm, in accordance with some embodiments. The thickness $T_1$ of the semiconductor layer 320a is greater than the thickness $T_2$ of the source electrode 144 or the drain electrode 146, in accordance with some embodiments. The thickness $T_1$ of the semiconductor layer 320a is greater than the thickness $T_3$ of the insulating layer 142, in accordance with some embodiments.

In some embodiments, the substrate 110 is configured to be a bottom gate electrode. The semiconductor layer 320a is configured to provide a channel between the source electrode 144 and the drain electrode 146, in accordance with some embodiments. Therefore, the length L of the gap G is close to a channel length of the channel in the semiconductor layer 320a over the gap G, in accordance with some embodiments. The width W of the gap G is equal to a channel width of the channel in the semiconductor layer 320a over the gap G, in accordance with some embodiments.

Figures 1, 4:
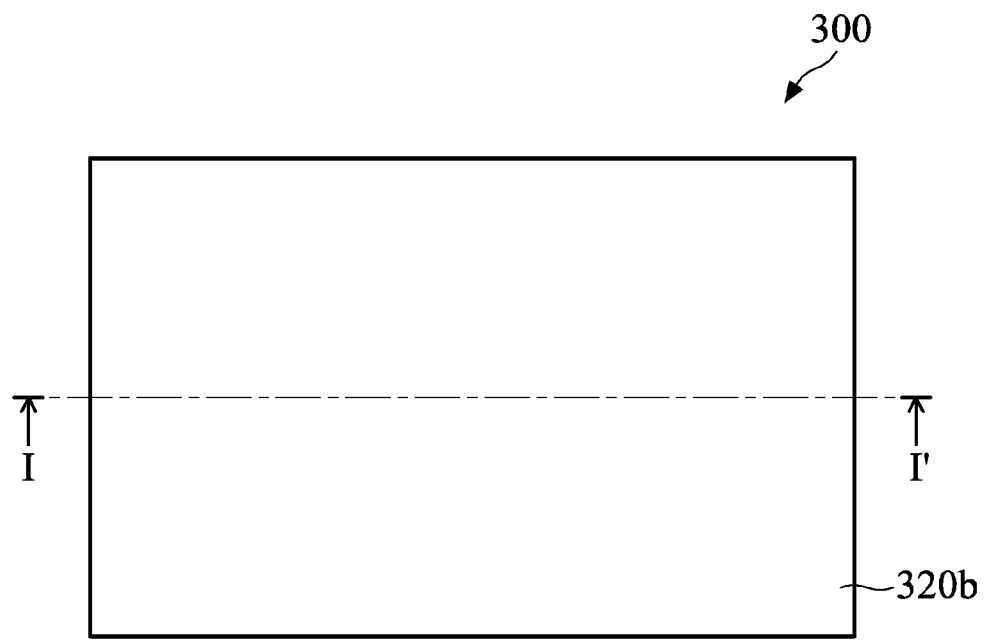
Figures 2, 4:
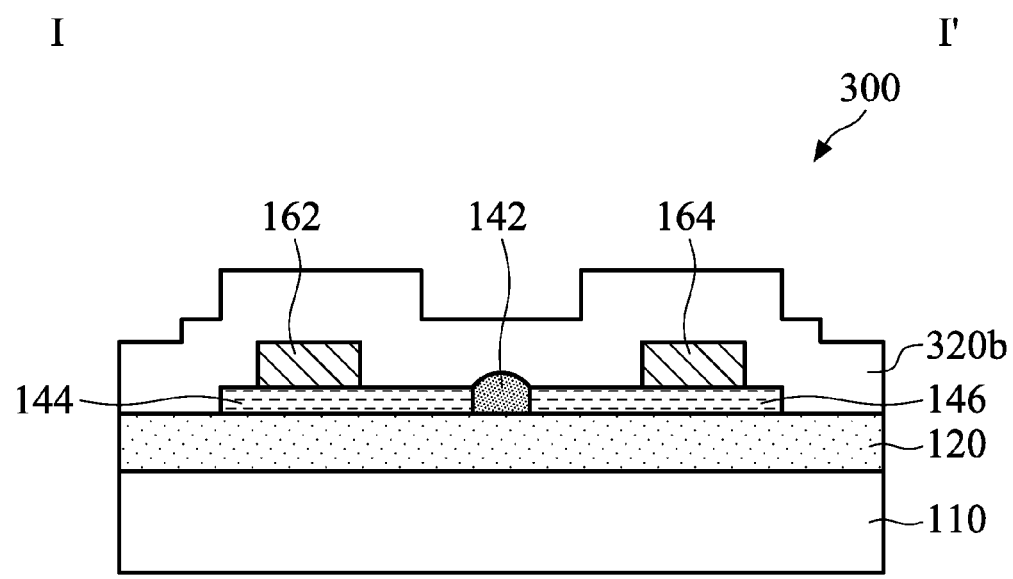

Alternatively, in some other embodiments, as shown in FIGS. 4-1 and 4-2, the semiconductor layer 320a is formed by depositing a semiconductor material layer 320b over the insulating layer 142, the source electrode 144, the drain electrode 146, the insulating layer 120, the first conductive structure 162, and the second conductive structure 164, and performing a photolithography process and an etching process. The semiconductor material layer 320b is deposited using, for example, a CVD process, in accordance with some embodiments. The semiconductor material layer 320b includes a transition metal chalcogenide, in accordance with some embodiments.

As shown in FIGS. 3K-1 and 3K-2, a gate dielectric layer 170 is formed over the semiconductor layer 320a, in accordance with some embodiments. The gate dielectric layer 170 is positioned over the gap G (or the insulating layer 142), the source electrode 144, the drain electrode 146, and the insulating layer 120, in accordance with some embodiments. The gate dielectric layer 170 is formed using a chemical vapor deposition process or another suitable process.

As shown in FIGS. 3L-1 and 3L-2, a gate electrode 180 is formed over the gate dielectric layer 170, in accordance with some embodiments. The gate electrode 180 is over the semiconductor layer 320a above the gap G (or the insulating layer 142), in accordance with some embodiments. The gate electrode 180 is configured to be a top gate electrode of the semiconductor device structure 300, in accordance with some embodiments. The semiconductor device structure 300 may be a top-gate transistor or a dual-gate transistor, which has the top gate electrode 180 and the bottom gate electrode 110.

Figures 1, 5A:
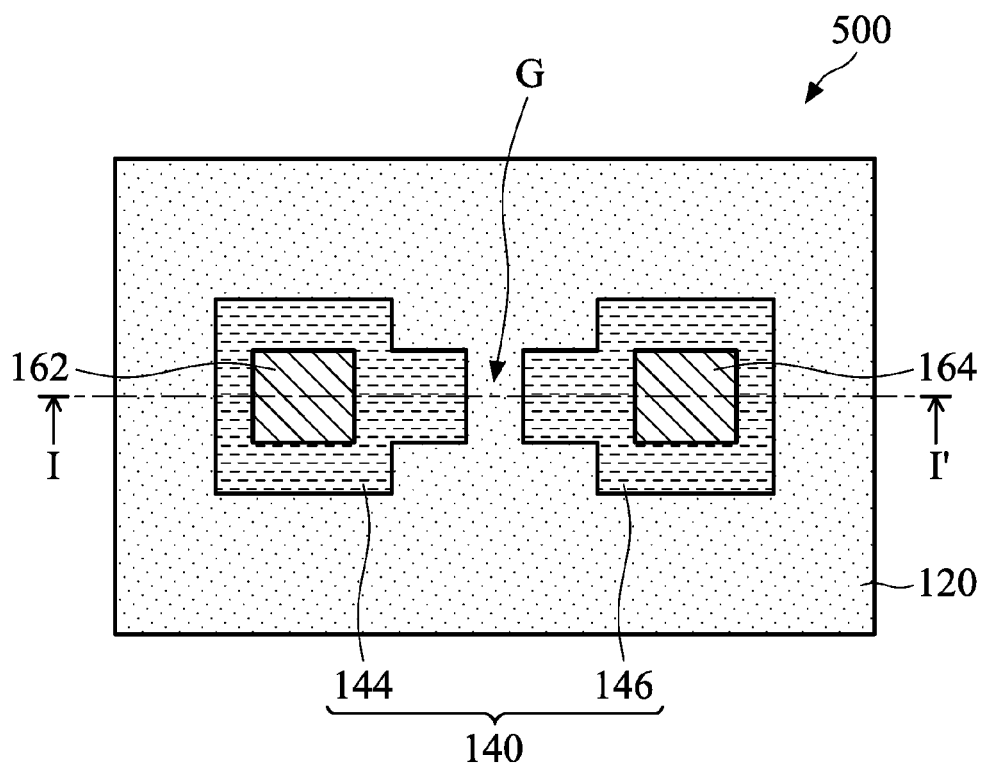
Figures 2, 5A:
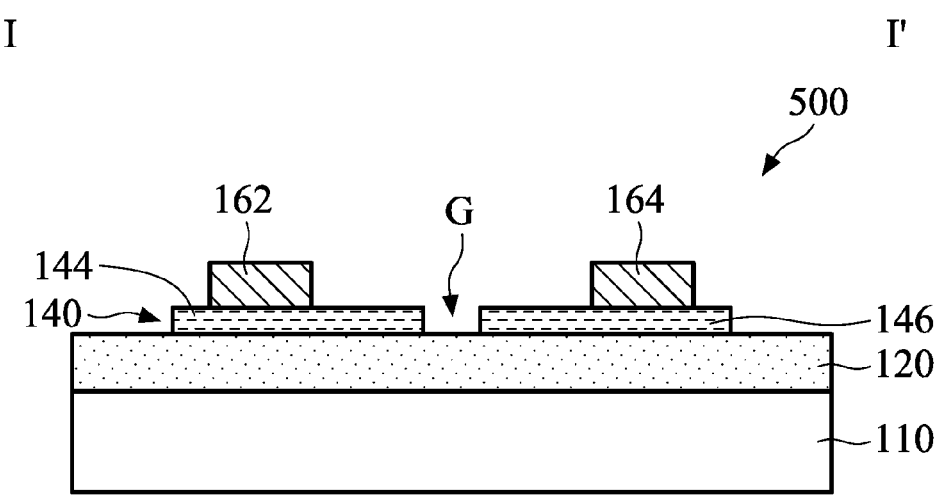
Figures 1, 5B:
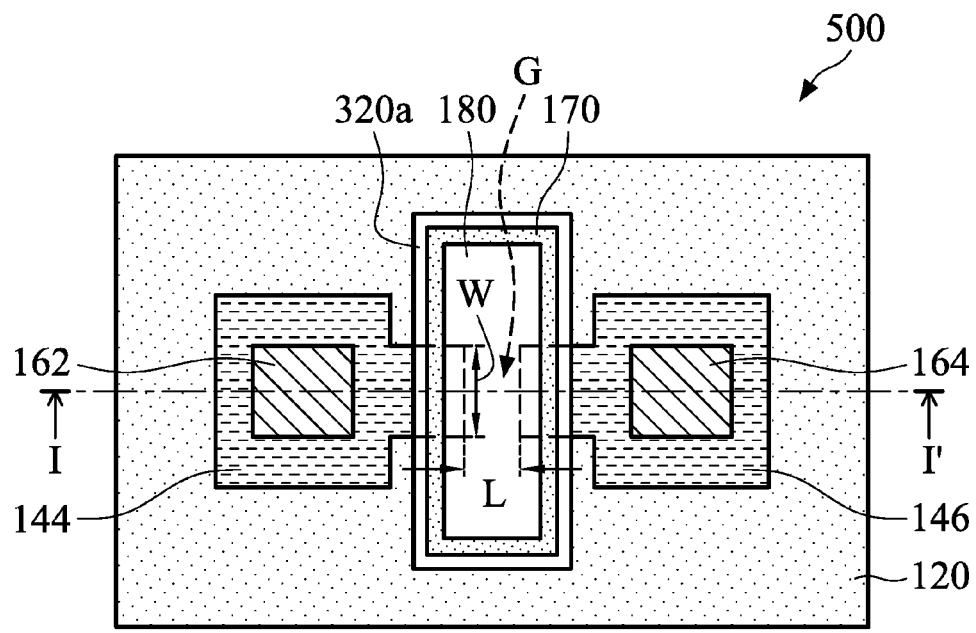
Figures 2, 5B:
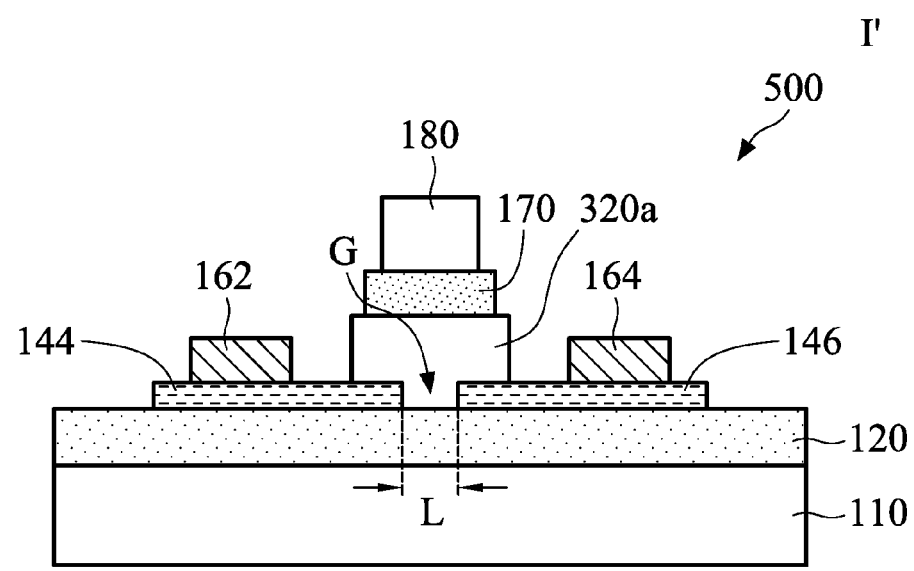

FIGS. 5A-1 to 5B-1 are top views of various stages of a process for forming a semiconductor device structure 500, in accordance with some embodiments. FIGS. 5A-2 to 5B-2 are cross-sectional views illustrating a semiconductor device structure 500 along a sectional line I-I' in FIGS. 5A-1 to 5B-1 respectively, in accordance with some embodiments.

In FIGS. 5A-1 to 5B-1 and 5A-2 to 5B-2, elements designed by the same reference numbers as those in FIGS. 3A-1 to 3L-1 and 3A-2 to 3L-2, have the same materials and the same or similar manufacturing methods as those in FIGS. 3A-1 to 3L-1 and 3A-2 to 3L-2, in accordance with some embodiments.

After the step of FIGS. 3E-1 and 3E-2, as shown in FIGS. 5A-1 and 5A-2, a portion of the graphene layer 140 is removed, in accordance with some embodiments. After the removal process, a gap G is formed in the graphene layer 140, in accordance with some embodiments. The gap G exposes a portion of the insulating layer 120, in accordance with some embodiments. The gap G defines and electrically isolates a source electrode 144 and a drain electrode 146 of the graphene layer 140, in accordance with some embodiments.

The removal process includes an ion beam etching process, in accordance with some embodiments. The ion beam etching process includes a helium ion beam etching process, a focused ion beam etching process, or another suitable ion beam etching process. The removal process includes an electron beam lithography (EBL) process and an etching process, in accordance with some embodiments.

After the steps of FIGS. 3G-1 to 3L-1 and 3G-2 to 3L-2, as shown in FIGS. 5B-1 and 5B-2, a semiconductor layer 320a is formed in the gap G between the source electrode 144 and the drain electrode 146, in accordance with some embodiments. The semiconductor layer 320a covers the portions of the source electrode 144, the drain electrode 146, and the insulating layer 120 adjacent to the gap G, in accordance with some embodiments.

As shown in FIGS. 5B-1 and 5B-2, a gate dielectric layer 170 is formed over the semiconductor layer 320a, in accordance with some embodiments. The gate dielectric layer 170 is positioned over the gap G, the source electrode 144, the drain electrode 146, and the insulating layer 120, in accordance with some embodiments. The gate dielectric layer 170 is formed using a chemical vapor deposition process or another suitable process.

As shown in FIGS. 5B-1 and 5B-2, a gate electrode 180 is formed over the gate dielectric layer 170, in accordance with some embodiments. The gate electrode 180 is over the semiconductor layer 320a in the gap G, in accordance with some embodiments. The gate electrode 180 is configured to be a top gate electrode of the semiconductor device structure 500, in accordance with some embodiments.

The semiconductor device structure 500 may be a top-gate transistor. In some embodiments, the substrate 110 is configured to be a bottom gate electrode. The semiconductor device structure 500 may be a dual-gate transistor, which has the top gate electrode 180 and the bottom gate electrode 110.

The gap G has a length L and a width W, in accordance with some embodiments. The length L is equal to a distance between the source electrode 144 and the drain electrode 146, in accordance with some embodiments. Therefore, the length L is also equal to a channel length of a channel in the semiconductor layer 320a in and/or over the gap G, in accordance with some embodiments. The width W is equal to a channel width of the channel in the semiconductor layer 320a in and/or over the gap G, in accordance with some embodiments. The width W is greater than the length L, in accordance with some embodiments.

Since the ion beam etching process or the electron beam lithography process is able to form a fine pattern, the length L (or the channel length) is less than 10 nm. The small length L improves the mobility and the performance of the semiconductor device structure 500, in accordance with some embodiments.

In accordance with some embodiments, semiconductor device structures and methods for forming the same are provided. The methods (for forming the semiconductor device structure) form a graphene source electrode and a graphene drain electrode over a transition metal chalcogenide semiconductor layer. Since the contact resistance between graphene and transition metal chalcogenide is low, the performance of the semiconductor device structure is improved. The methods form a narrow gap between the graphene source electrode and the graphene drain electrode to reduce a channel length of a channel in the transition metal chalcogenide semiconductor layer, which improves the mobility and the performance of the semiconductor device structure.

In accordance with some embodiments, a semiconductor device structure is provided. The semiconductor device structure includes a substrate. The semiconductor device structure includes a semiconductor layer over the substrate. The semiconductor layer includes a transition metal chalcogenide. The semiconductor device structure includes a source electrode and a drain electrode over and connected to the semiconductor layer and spaced apart from each other by a gap. The source electrode and the drain electrode are made of graphene.

In accordance with some embodiments, a semiconductor device structure is provided. The semiconductor device structure includes a substrate. The semiconductor device structure includes a source electrode and a drain electrode over the substrate and spaced apart from each other by a gap. The source electrode and the drain electrode are made of graphene. The semiconductor device structure includes a semiconductor layer covering the gap, a first portion of the source electrode, and a second portion of the drain electrode. The semiconductor layer includes a transition metal chalcogenide.

In accordance with some embodiments, a method for forming a semiconductor device structure is provided. The method includes forming a semiconductor layer over a substrate. The semiconductor layer includes a transition metal chalcogenide. The method includes forming a graphene layer over or under the semiconductor layer. The method includes patterning the graphene layer into a source electrode and a drain electrode. The source electrode and the drain electrode are spaced apart from each other by a gap and connected to the semiconductor layer, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate;
a semiconductor layer over the substrate, wherein the semiconductor layer comprises a transition metal chalcogenide;
a source electrode and a drain electrode over and connected to the semiconductor layer and spaced apart from each other by a gap, wherein the source electrode and the drain electrode are made of graphene; and
an insulating layer filled in the gap and protruding from the gap, wherein the insulating layer is an oxide layer.

2. The semiconductor device structure as claimed in claim 1, wherein the insulating layer is thicker than the source electrode or the drain electrode.

3. The semiconductor device structure as claimed in claim 1, wherein the insulating layer comprises carbon and oxide.

4. The semiconductor device structure as claimed in claim 1, further comprising:
a gate dielectric layer covering the insulating layer; and
a gate electrode over the gate dielectric layer and above the insulating layer.

5. The semiconductor device structure as claimed in claim 4, wherein a top portion of the insulating layer is embedded in the gate dielectric layer.

6. The semiconductor device structure as claimed in claim 1, wherein the transition metal chalcogenide comprises $MoS_2$, $WS_2$, $HfS_2$, $MoCe_2$, $MoSe_2$, $WSe_2$, or $MoSe_2$.

7. The semiconductor device structure as claimed in claim 1, further comprising:
a first conductive structure over and electrically connected to the source electrode; and
a second conductive structure over and electrically connected to the drain electrode, wherein the first conductive structure and the second conductive structure are made of gold or silver.

8. The semiconductor device structure as claimed in claim 1, further comprising:
a gate dielectric layer covering the semiconductor layer under the gap; and
a gate electrode over the gate dielectric layer and the gap.

9. A semiconductor device structure, comprising:
a substrate;
a source electrode and a drain electrode over the substrate and spaced apart from each other by a gap, wherein the source electrode and the drain electrode are made of graphene;
a semiconductor layer covering the gap, a first portion of the source electrode, and a second portion of the drain electrode, wherein the semiconductor layer comprises a transition metal chalcogenide;
a gate dielectric layer covering the semiconductor layer over the gap; and
a gate electrode over the gate dielectric layer and above the gap.

10. The semiconductor device structure as claimed in claim 9, further comprising:
an insulating layer filled in the gap and protruding from the gap, wherein the semiconductor layer covers the insulating layer.

11. The semiconductor device structure as claimed in claim 10, wherein the insulating layer is an oxide layer.

12. The semiconductor device structure as claimed in claim 11, wherein the insulating layer comprises carbon and oxide.

13. The semiconductor device structure as claimed in claim 10, wherein a top portion of the insulating layer extends into the semiconductor layer.

14. The semiconductor device structure as claimed in claim 9, further comprising:
a first conductive structure over and electrically connected to the source electrode; and
a second conductive structure over and electrically connected to the drain electrode, wherein the first conductive structure and the second conductive structure are made of gold or silver.

15. A method for forming a semiconductor device structure, comprising:
forming a semiconductor layer over a substrate, wherein the semiconductor layer comprises a transition metal chalcogenide;
forming a graphene layer over or under the semiconductor layer; and
patterning the graphene layer into a source electrode and a drain electrode, wherein the source electrode and the drain electrode are spaced apart from each other by a gap and individually connected to the semiconductor layer, an insulating layer is formed in the gap and protrudes from the gap, and the insulating layer is an oxide layer.

16. The method for forming a semiconductor device structure as claimed in claim 15, wherein the step of patterning the graphene layer comprises:

performing an oxidation process to oxidize the graphene layer in the gap into the insulating layer, wherein the insulating layer is filled in the gap.

17. The method for forming a semiconductor device structure as claimed in claim 16, wherein the oxidation process uses an atomic force microscope.

18. The method for forming a semiconductor device structure as claimed in claim 16, wherein the oxidation process comprises an anode oxidation process.

19. The method for forming a semiconductor device structure as claimed in claim 15, wherein the formation of the semiconductor layer and the graphene layer comprises:

performing a first chemical vapor deposition process to form the semiconductor layer; and performing a second chemical vapor deposition process to form the graphene layer.

20. The method for forming a semiconductor device structure as claimed in claim 15, further comprising:

forming a gate dielectric layer covering the semiconductor layer adjacent to the gap; and forming a gate electrode over the gate dielectric layer and above the gap.

\* \* \* \* \*